United States Patent
Lau et al.

(10) Patent No.: US 9,966,519 B2
(45) Date of Patent: May 8, 2018

(54) GALLIUM NITRIDE FLIP-CHIP LIGHT EMITTING DIODE

(71) Applicant: The Hong Kong University of Science and Technology, Kowloon (HK)

(72) Inventors: Kei May Lau, Kowloon (HK); Wing Cheung Chong, New Territories (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 8 days.

(21) Appl. No.: 15/310,869

(22) PCT Filed: May 15, 2015

(86) PCT No.: PCT/CN2015/079019
§ 371 (c)(1),
(2) Date: Nov. 14, 2016

(87) PCT Pub. No.: WO2015/172733
PCT Pub. Date: Nov. 19, 2015

(65) Prior Publication Data
US 2017/0092829 A1 Mar. 30, 2017

Related U.S. Application Data

(60) Provisional application No. 61/996,747, filed on May 15, 2014.

(51) Int. Cl.
*H01L 33/62* (2010.01)
*H01L 33/00* (2010.01)
(Continued)

(52) U.S. Cl.
CPC ............ *H01L 33/62* (2013.01); *H01L 33/007* (2013.01); *H01L 33/0075* (2013.01);
(Continued)

(58) Field of Classification Search
CPC combination set(s) only.
See application file for complete search history.

(56) References Cited

U.S. PATENT DOCUMENTS 6,573,537 B1  6/2003  Steigerwald et al.
6,614,056 B1  9/2003  Tarsa et al.
(Continued)

FOREIGN PATENT DOCUMENTS

CN  103022334 A  4/2013
CN  103794695 A  5/2014
(Continued)

OTHER PUBLICATIONS

Shchekin, et al., "High performance thin-film flip-chip InGaN—GaN light-emitting diodes," doi: 10.1063/1.2337007, 2006, 4 pages.
(Continued)

*Primary Examiner* — Mamadou Diallo
(74) *Attorney, Agent, or Firm* — Amin, Turocy & Watson, LLP

(57) ABSTRACT

Techniques are provided for forming a gallium nitride flip-chip light-emitting diode. In an aspect, a device is provided that includes a gallium nitride layer, a passivation layer, a set of first conductive layers, and a second conductive layer. The gallium nitride layer is formed on a substrate that includes a first plurality of recesses associated with a first structure and a second plurality of recesses associated with a second structure, where the first plurality of recesses and the second plurality of recesses are associated with a first conductive material. The set of first conductive layers is formed on the passivation layer and corresponds to the first conductive material. The second conductive layer is formed on the passivation layer and corresponds to a second conductive material.

29 Claims, 22 Drawing Sheets

(51) Int. Cl.
*H01L 33/32* (2010.01)
*H01L 33/42* (2010.01)
*H01L 33/44* (2010.01)
*H01L 33/20* (2010.01)
*H01L 33/38* (2010.01)

(52) U.S. Cl.
CPC .............. *H01L 33/20* (2013.01); *H01L 33/32* (2013.01); *H01L 33/382* (2013.01); *H01L 33/387* (2013.01); *H01L 33/42* (2013.01); *H01L 33/44* (2013.01); *H01L 2933/0016* (2013.01); *H01L 2933/0025* (2013.01); *H01L 2933/0066* (2013.01)

(56) References Cited

U.S. PATENT DOCUMENTS

| | | | |
|---|---|---|---|
| 7,015,512 | B2 | 3/2006 | Park et al. |
| 8,158,990 | B2 | 4/2012 | Joichi et al. |
| 8,680,580 | B2* | 3/2014 | Ota .................. H01L 29/7787 |
| | | | 257/190 |
| 9,685,329 | B2* | 6/2017 | Gallagher ......... H01L 21/31116 |
| 2013/0032839 | A1* | 2/2013 | Shen .................. H01L 33/007 |
| | | | 257/98 |
| 2013/0306964 | A1 | 11/2013 | Han |
| 2013/0307063 | A1* | 11/2013 | Kambayashi ..... H01L 29/66462 |
| | | | 257/330 |
| 2015/0357993 | A1* | 12/2015 | Shealy .................. H03H 9/205 |
| | | | 310/321 |

FOREIGN PATENT DOCUMENTS

| | | |
|---|---|---|
| CN | 104064634 A | 9/2014 |
| CN | 104241511 A | 12/2014 |
| JP | 2004047988 A | 2/2004 |
| JP | 2007067257 A | 3/2007 |
| TW | 201324863 A | 6/2013 |
| WO | 2015172733 A1 | 11/2015 |

OTHER PUBLICATIONS

Zakheim, et al., "Array of InGaAsSb light-emitting diodes (λ= 3.7 μm)," Physics of Semiconductor Devices, Apr. 2009, vol. 43, Issue 4, 5 pages.

Imler, et al., "Precision Flip-Chip Solder Bump Wire Bonds Interconnects for Optical Packaging," IEEE Transactions on Components, Hybrids, and Manufacturing Technology,vol. 15, No. 6, Dec. 1992, 6 pages.

International Search Report for PCT Application Serial No. PCT/CN2015/079019, dated Nov. 24, 2016, 4 pages.

* cited by examiner

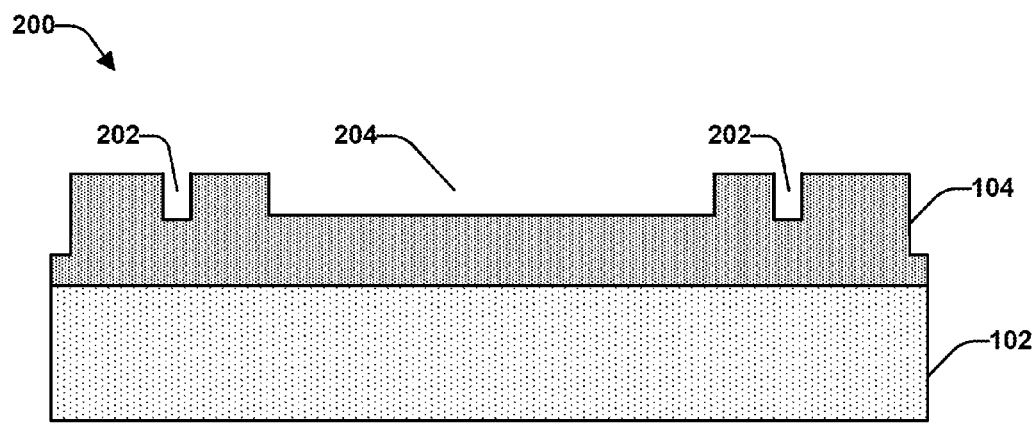
FIG. 2
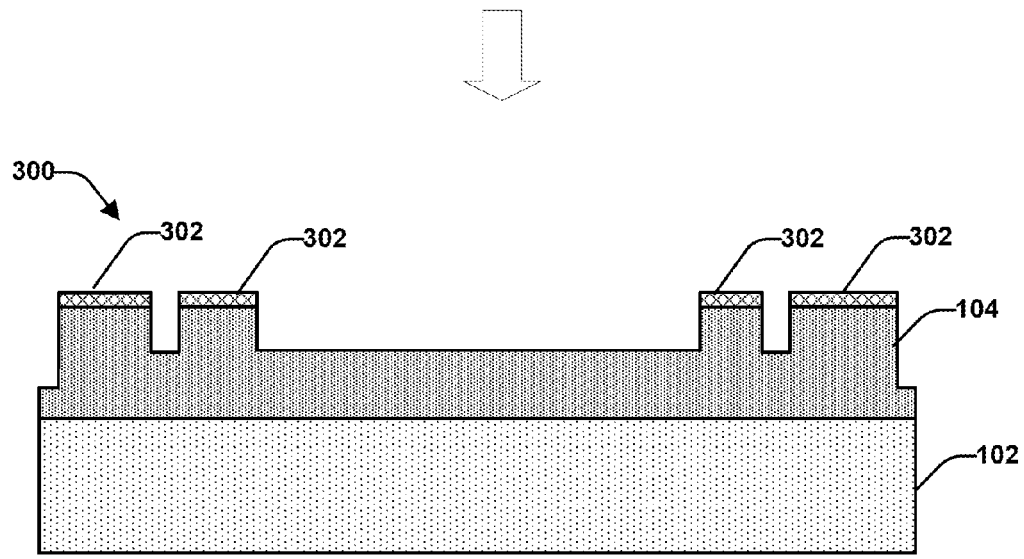
FIG. 3
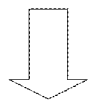

FROM FIG. 3
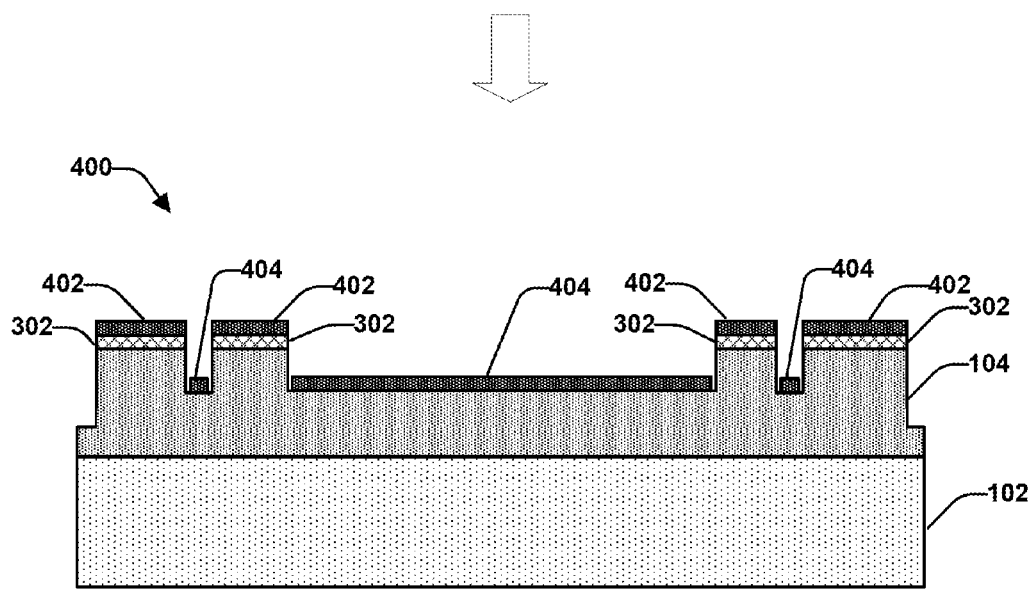
FIG. 4A

FROM FIG. 3

FROM FIG. 4A

FROM FIG. 5A

GALLIUM NITRIDE FLIP-CHIP LIGHT EMITTING DIODE

RELATED APPLICATION

This application is a U.S. National Stage filing under 35 U.S.C. § 371 of international patent cooperation treaty (PCT) application No. PCT/CN2015/079019, filed May 15, 2015, and entitled "GALLIUM NITRIDE FLIP-CHIP LIGHT EMITTING DIODE", which claims priority to U.S. Provisional Patent Application No. 61/996,747 filed on May 15, 2014, and entitled "Light Emitting Diode with High Density Point-Contacts." The entirety of the aforementioned application is incorporated by reference herein.

TECHNICAL FIELD

This disclosure relates generally to a gallium nitride flip-chip light-emitting diode.

BACKGROUND

Recently, development of light-emitting diodes (LEDs) for solid-state lighting has rapidly increased due to numerous advantages associated with LEDs, such as, for example, high luminous efficacy, a long lifetime compared to traditional light sources, etc. However, application of LEDs toward general lighting generally requires higher brightness and/or higher wall-plug efficiency (WPE) than traditional light sources. Flip-chip LEDs (FCLEDs) are also becoming increasingly popular for high power solid-state lighting. However, performance (e.g., optical performance, electrical performance, etc.) of a FCLED can be improved.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

FIG. 2 presents a cross-sectional view of an example intermediate device structure associated with a process for fabricating a device, in accordance with one or more embodiments described herein;

FIG. 3 presents a cross-sectional view of another example intermediate device structure associated with the process for fabricating the device, in accordance with one or more embodiments described herein;

FIG. 4A presents a cross-sectional view of yet another example intermediate device structure associated with the process for fabricating the device, in accordance with one or more embodiments described herein;

DETAILED DESCRIPTION

Figure 1:
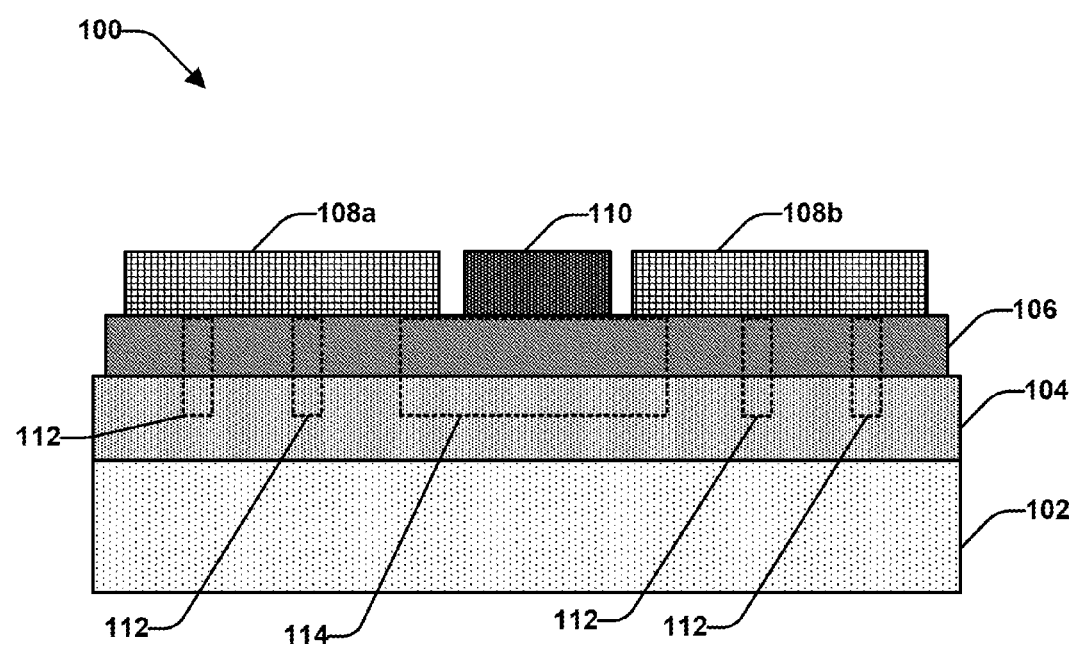
FIG. 1 presents a side view of an example device, in accordance with one or more embodiments described herein.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

Recently, development of light-emitting diodes for solid-state lighting has rapidly increased due to numerous advantages associated with light-emitting diodes, such as, for example, high luminous efficacy, a long lifetime compared to traditional light sources, etc. However, application of light-emitting diodes toward general lighting generally requires higher brightness and/or higher wall-plug efficiency (WPE) than traditional light sources. Flip-chip light-emitting diodes are also becoming increasingly popular for high power solid-state lighting. For example, a metal contact (e.g., a p-type metal contact) at a bottom surface of a flip-chip light-emitting diode can improve current spreading over a p-type layer of the flip-chip light-emitting diode and/or can reflect downward propagating light upward for better extraction. However, performance (e.g., optical performance, electrical performance, etc.) of a flip-chip light-emitting diode can be negatively impacted by light trapping in a bulk substrate of the flip-chip light-emitting diode, by a current crowding effect associated with a contact (e.g., an n-type contact) of the flip-chip light-emitting diode, and/or by efficiency droop at high current injection.

To these and/or related ends, various embodiments disclosed herein provide a structure and/or a fabrication method (e.g., manufacturing method) for an improved gallium nitride flip-chip light-emitting diode (FCLED). In one example, the gallium nitride FCLED can be a point-contact FCLD (PC-FCLED). The gallium nitride FCLED can include high-density and/or uniformly distributed n-type point-contacts (e.g., etched holes). As such, the gallium nitride FCLED can be associated with improved optical performance and/or improved electrical performance. For example, the gallium nitride FCLED can be associated with increased light output power (e.g., increased light output power at low input power), increased light extraction, increased uniform carrier distribution and/or increased WPE as compared to a conventional FCLED with conventional contacts. Furthermore, forward voltage associated with the gallium nitride FCLED can be lower than forward voltage of a conventional FCLED with conventional contacts.

In an embodiment, a method provides for forming a gallium nitride layer on a substrate, where the gallium nitride layer comprises a first set of recessed structures and a second set of recessed structures, forming a conductive layer associated with the gallium nitride layer, forming a first conductive contact associated with the conductive layer and a set of second conductive contacts associated with the first set of recessed structures and the second set of recessed structures, depositing a passivation layer on the first conductive contact, the set of second conductive contacts and/or the gallium nitride layer, forming a first contact layer (e.g., a first conductive layer) on the passivation layer that is associated with the first conductive contact, and forming a set of second contact layers (e.g., a set of second conductive layers) on the passivation layer that is associated with the second set of conductive contacts.

In another embodiment, a device includes a gallium nitride layer, a passivation layer, a first conductive layers (e.g., a first contact layer), and a set of second conductive layer (e.g., a set of second contact layers). The gallium nitride layer is formed on a substrate that includes a first plurality of recesses associated with a first structure and a second plurality of recesses associated with a second structure, where the first plurality of recesses and the second plurality of recesses are associated with a first conductive material. The first conductive layers is formed on the passivation layer and corresponds to a second conductive material. The set of second conductive layers are formed on the passivation layer and corresponds to the first conductive material. In an aspect, the second conductive material can be formed on the gallium nitride layer. In another aspect, the passivation layer can be formed on the first conductive material, the second conductive material, and the gallium nitride layer.

In yet another embodiment, a device includes a gallium nitride layer, a first conductive material, a second conductive material, a passivation layer, a first contact layer, and a set of second contact layers. The gallium nitride layer is formed on a substrate that includes a first plurality of recesses associated with a first structure and a second plurality of recesses associated with a second structure, where the first plurality of recesses and the second plurality of recesses are associated with the first conductive material. The second conductive material is formed on the gallium nitride layer. The passivation layer is formed on the first conductive material, the second conductive material and the gallium nitride layer. The first contact layer is formed on the passivation layer and is associated with the second conductive material. The set of second contact layer is formed on the passivation layer and is associated with the first conductive layers.

In yet another embodiment, a system includes a light-emitting diode and a substrate (e.g., a device). The light-emitting diode includes a gallium nitride layer formed on a substrate, a passivation layer formed on the gallium nitride layer, a first conductive layer formed on a portion of the passivation layer that corresponds to a set of recesses formed in the gallium nitride layer, and a second conductive layer formed on another portion of the passivation layer. The light-emitting diode is bonded to the substrate (e.g., the device).

In yet another embodiment, a device includes a gallium nitride layer, a passivation layer, a second conductive material, a first conductive layer (e.g., a first contact layer), and a second conductive layer (e.g., a second contact layer). The gallium nitride layer is formed on a substrate that comprises a plurality of recessed structures associated with a set of first conductive materials. The second conductive material is formed on the gallium nitride layer. The passivation layer is formed on the first conductive material, the second conductive material, and the gallium nitride layer. The first conductive layer is formed on the passivation layer and corresponds to the set of first conductive materials. The set of second conductive layers is formed on the passivation layer and corresponds to the second conductive material.

In yet another embodiment, a method provides for forming a gallium nitride layer on a substrate, the gallium nitride layer comprising a set of recessed structures, forming a conductive contact on the gallium nitride layer and a set of conductive contacts associated with the set of recessed structures, depositing a passivation layer on the conductive contact and the set of conductive contacts, forming a first conductive layer on the passivation layer that is associated with the conductive contact, and forming a set of second conductive layers on the passivation layer that is associated with the set of conductive contacts.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

To the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

Conventional light-emitting diodes (e.g., flip-chip light-emitting diodes, etc.) have some drawbacks with respect to efficiency, performance (e.g., optical performance, electrical performance, etc.), etc. On the other hand, various embodiments disclosed herein provide for an improved light-emitting diode (e.g., an improved flip-chip light-emitting diode). In this regard, and now referring to the drawings, FIG. 1 presents a side view of an example device 100 fabricated in accordance with one or more embodiments described herein. In one example, the device 100 can be a gallium nitride flip-chip light-emitting diode (LED). In another example, the device 100 can be a point-contact flip-chip LED (PC-FCLED). The device 100 can simultaneously provide high brightness and low voltage (e.g., lower operating voltage) as compared to a conventional FCLED. Furthermore, the device 100 can be associated with higher efficiency, lower manufacturing cost and/or a longer lifespan as compared to a conventional FCLED. The device 100 can be employed for various lighting applications, such as but not limited to, lighting for a display, LED light bulbs (e.g., high brightness LED light bulbs, etc.), LED bullets (e.g., low power LED bullets), other lighting applications, etc.

The device 100 can include a substrate 102, a gallium nitride layer 104 and a passivation layer 106. In an aspect, the gallium nitride layer 104 can comprise a p-type gallium nitride layer and an n-type gallium nitride layer. The gallium nitride layer 104 can be formed on the substrate 102. In one example, the substrate 102 can be a sapphire substrate. In another example, the substrate 102 can be a silicon substrate. In yet another example, the substrate 102 can be a silicon carbide substrate. In yet another example, the substrate 102 can be a gallium nitride substrate. However, it is to be appreciated that the substrate 102 can be a different type of substrate. Furthermore, the passivation layer 106 can be formed on the gallium nitride layer 104. In one example, the passivation layer 106 can be an oxide layer (e.g., a silicon dioxide layer). In another example, the passivation layer 106 can be a nitride layer. In yet another example, the passivation layer 106 can be a polymer layer. In another example, the passivation layer 106 can be a polyimide layer. The device 100 can also include a set of first conductive layers 108*a-b* (e.g., a first conductive layer 108*a* and another first conductive layer 108*b*, as set of first contact layers 108*a-b*, etc.) and a second conductive layer 110 (e.g., a second contact layer 110). The set of first conductive layers 108*a-b* and/or the second conductive layer 110 can be formed on the passivation layer 106. Furthermore, the second conductive layer 110 can be implemented between the first conductive layer 108*a* and the other first conductive layer 108*b*. In an implementation, a phosphor film can be applied to a surface of the substrate 102 (e.g., a surface of the substrate 102 that is not associated with the gallium nitride layer 104).

In an aspect, the gallium nitride layer 104 can be associated with a first plurality of recesses 112 associated with a first structure and a second plurality of recesses 114 associated with a second structure. For example, the first plurality of recesses 112 can be a first plurality of recessed structures and the second plurality of recesses 114 can be a second plurality of recessed structures. Additionally or alternatively, the passivation layer 106 can be associated with the first plurality of recesses 112 and the second plurality of recesses 114. The first plurality of recesses 112 and/or the second plurality of recesses 114 can be associated with a first conductive material (e.g., an n-type electrode). The set of first conductive layers 108*a-b* can correspond to the first conductive material. Additionally or alternatively, the second conductive layer 110 can correspond to a second conductive material (e.g., a p-type electrode). In an implementation, the second plurality of recesses 114 can comprise a larger surface area than the first plurality of recesses 112. In another implementation, the second plurality of recesses 114 can comprise a smaller surface area than the first plurality of recesses 112. In yet another implementation, the device 100 can be implemented without the second plurality of recesses 114 (e.g., the device can only include the first plurality of recesses 112). In certain implementations, the set of first conductive layers 108*a-b* and the second conductive layer 110 can be bonded to another substrate (e.g., another device). For example, the set of first conductive layers 108*a-b* and the second conductive layer 110 can be soldered to another substrate (e.g., another device). In one example, the other substrate (e.g., the other device) bonded to the set of first conductive layers 108*a-b* and the second conductive layer 110 can be an integrated chip.

FIGS. 2-7 pictorially depict an example process for fabricating the device 100 (e.g., a gallium nitride FCLED, a PC-FCLED, etc.). Repetitive description of like elements employed in other embodiments described herein is omitted for sake of brevity. With reference to FIG. 2 presented is a cross-sectional view of an intermediate device structure 200 that includes the substrate 102 and the gallium nitride layer 104. In one example, the intermediate device structure 200 can be associated with mesa and/or n-contact definitions. The gallium nitride layer 104 can be associated with a gallium nitride (GaN) epitaxial wafer. Furthermore, the gallium nitride layer 104 can be formed on the substrate 102 via chemical vapor deposition. In one example, the gallium nitride layer 104 can be a GaN epitaxial layer (e.g., a blue LED GaN epitaxial layer) that is formed on (e.g., grown on) the substrate 102 via metalorganic chemical vapor deposition (MOCVD). The gallium nitride layer 104 can be, for example, an n-type gallium nitride layer. In a non-limiting example, the gallium nitride layer 104 can comprise a peak emission wavelength of 450 nm. However, it is to be appreciated that the gallium nitride layer 104 can comprise a different peak emission wavelength. In another non-limiting example, the gallium nitride layer 104 can be a 1×1 mm² LED mesa structure. However, it is to be appreciated that the gallium nitride layer 104 can comprise a different size and/or structure.

In an aspect, the gallium nitride layer 104 can include one or more first recessed structures 202. Additionally, in an implementation, the gallium nitride layer 104 can include one or more second recessed structures 204. The one or more first recessed structures 202 can be one or more point-contact holes. The one or more second recessed structures 204 can be one or more electrode stripe holes. In a non-limiting example, a first recessed structure 202 can be an 11×11 μm² point-contact hole. However, it is to be appreciated that a first recessed structure 202 can comprise a different size. The one or more first recessed structures 202 and/or the one or more second recessed structures 204 can be patterned by photolithography. For example, the one or more first recessed structures 202 and/or the one or more second recessed structures 204 can be formed based on a pattern formed by photolithography. Furthermore, the one or more first recessed structures 202 and/or the one or more second recessed structures 204 can be etched via inductively coupled plasma (ICP) etching.

The one or more first recessed structures 202 can be facilitate formation of point-contacts (e.g., etched holes). In one example, spacing between each of the one or more first recessed structures 202 can be constant (e.g., the one or more first recessed structures 202 can be uniformly distributed on a surface of the intermediate device structure 200). Furthermore, the one or more first recessed structures 202 can form a contact array on a surface of the intermediate device structure 600 and/or can provide a minimized lateral current spreading distance. For example, the one or more second recessed structures 204 can be formed between a first contact array of the first recessed structures 202 and a second contact array of the first recessed structures 202. The one or more first recessed structures 202 can cover 5%-15% of a surface area associated with the intermediate device structure 200. In an implementation, the one or more first recessed structures 202 can each be square-shaped with size that is less than or equal to 30 μm×30 μm (e.g., the openings 602 can each be a 10 μm×10 μm square-shaped opening, etc.). However, it is to be appreciated that the one or more first recessed structures 202 can each include a different shape (e.g., a circle shape, a hexagonal shape, another shape, etc.). Deepness of the one or more first recessed structures 202 and/or the one or more second recessed structures 204 can vary based on an epitaxial structure of the gallium nitride layer 104 on the substrate 102. In a non-limiting example, etching depth of one or more first recessed structures 202 and/or the one or more second recessed structures 204 can be between a range from 0.4 nm to 2.5 μm.

Referring now to FIG. 3, presented is a cross-sectional view of an intermediate device structure 300 that includes the substrate 102, the gallium nitride layer 104, and a conductive layer 302. The intermediate device structure 300 can be a next structure formed after the intermediate device structure 200 (e.g., in the process for fabricating the device 100). The conductive layer 302 can be formed on the gallium nitride layer 104 via electron beam evaporation. Furthermore, the conductive layer 302 can be a conductive oxide layer (e.g., an indium tin oxide layer, etc.). In another example, the conductive layer 302 can be a metal layer (e.g., nickel, gold, silver, another alloy, etc.). In a non-limiting example, the conductive layer 302 can comprise a thickness of 115 nm. However, it is to be appreciated that the conductive layer 302 can comprise a different thickness. The conductive layer 302 can be deposited on a p-type gallium nitride surface of the gallium nitride layer 104. In an implementation, the intermediate device structure 300 can undergo an annealing process at an atmospheric ambient pressure at a defined temperature and/or for a defined amount of time. In a non-limiting example, the intermediate device structure 300 can undergo an annealing process at an atmospheric ambient pressure at 600° C. for 5 minutes. However, it is to be appreciated that temperature and/or time for an annealing process associated with the intermediate device structure 300 can be varied.

Referring now to FIG. 4A, presented is a cross-sectional view of an intermediate device structure 400 that includes the substrate 102, the gallium nitride layer 104, the conductive layer 302, a conductive contact 402 (e.g., a conductive layer 402), and a conductive contact 404 (e.g., a conductive layer 404). In an aspect, the conducive contact 402 (e.g., the conductive layer 402) can be associated with a set of conductive contacts 402 (e.g., a set of conductive layer 402). Additionally or alternatively, the conducive contact 404 (e.g., the conductive layer 404) can be associated with a set of conductive contacts 404 (e.g., a set of conductive layer 404). The intermediate device structure 400 can be a next structure formed after the intermediate device structure 300 (e.g., in the process for fabricating the device 100). The conductive contact 402 and/or the conductive contact 404 can be formed by evaporating one or more conductive layers (e.g., one or more conductive contacts associated with the conductive layer 302, a set of conductive contacts associated with the one or more first recessed structures 202 and the one or more second recessed structures 204, etc.). In a non-limiting example, the conductive contact 402 and/or the conductive contact 404 can be formed by evaporating a chromium layer, an aluminum layer, a titanium layer and/or a gold layer. The conductive contact 402 can be a p-type conductive contact. For example, the conductive contact 402 can be a reflective p-type metal contact. The conductive contact 404 can be an n-type conductive contact. For example, the conductive contact 404 can be an n-type contact (e.g., an n-type electrode). Each of the one or more first recessed structures 202 and/or the one or more second recessed structures 204 can be associated with the conductive contact 404. In an aspect, the conductive contact 404 can facilitate formation of a first set of conductive contacts associated with the one or more first recessed structures 202 and a second set of conductive contacts associated with the one or more second recessed structures 204.

Figure 4B:
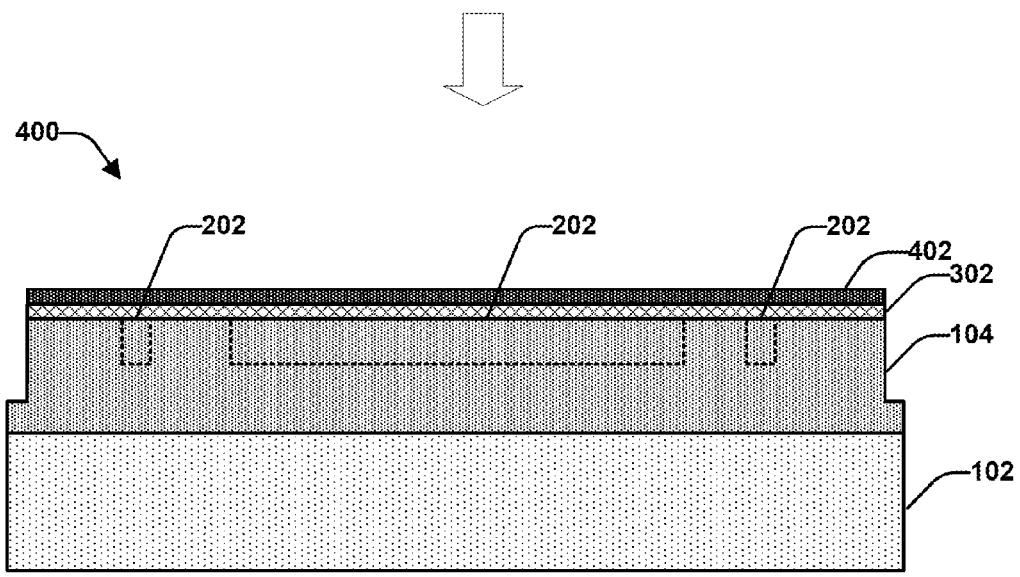
FIG. 4B presents an alternate cross-sectional view of the intermediate device structure presented in FIG. 4A, in accordance with one or more embodiments described herein.

Referring to FIG. 4B, presented is an alternate cross-sectional view of the intermediate device structure 400 that includes the substrate 102, the gallium nitride layer 104, the conductive layer 302 and the conductive contact 402. The intermediate device structure 400 can be a next structure formed after the intermediate device structure 300 (e.g., in the process for fabricating the device 100). As illustrated by the alternate cross-sectional view of the intermediate device structure 400 presented in FIG. 4B, the conductive contact 402 can correspond to an entire width of the gallium nitride layer 104.

Figure 5A:
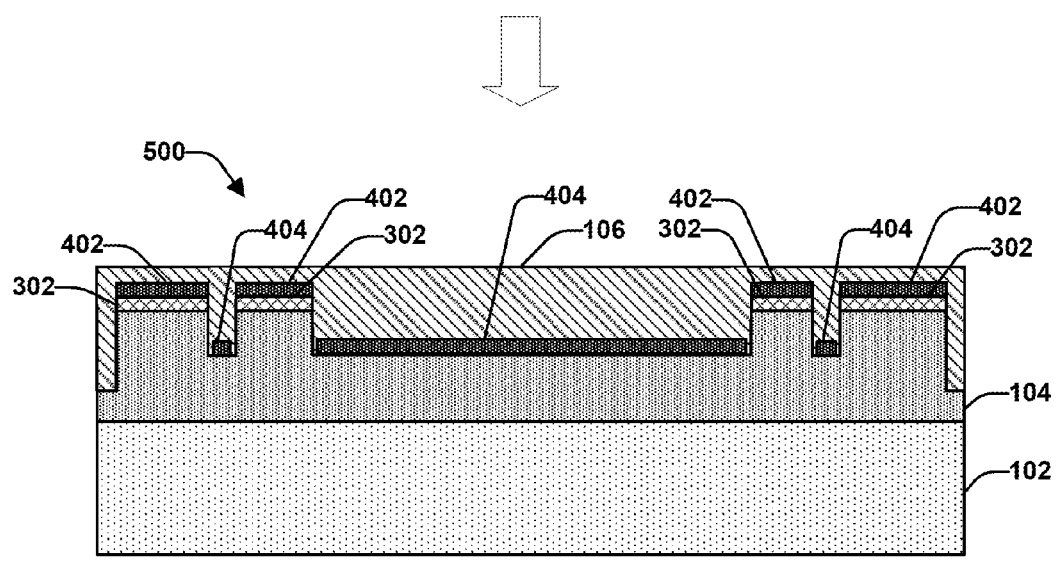
FIG. 5A presents a cross-sectional view of yet another example intermediate device structure associated with the process for fabricating the device, in accordance with one or more embodiments described herein.

Referring now to FIG. 5A, presented is a cross-sectional view of an intermediate device structure 500 that includes the substrate 102, the gallium nitride layer 104, the conductive layer 302, the conductive contact 402, the conductive contact 404, and the passivation layer 106. The intermediate device structure 500 can be a next structure formed after the intermediate device structure 400 (e.g., in the process for fabricating the device 100). The passivation layer 106 can be deposited on the conductive contact 402, the conductive contact 404 and the gallium nitride layer 104. For example, the passivation layer 106 can be deposited on the conductive contact 402, the conductive contact 404 and the gallium nitride layer 104 via plasma enhanced chemical vapor deposition (PECVD). In another example, the passivation layer 106 can be deposited on the conductive contact 402, the conductive contact 404 and the gallium nitride layer 104 via spin-coating. In yet another example, the passivation layer 106 can be deposited on the conductive contact 402, the conductive contact 404 and the gallium nitride layer 104 via spray-coating. The passivation layer 106 can be deposited on the conductive contact 402, the conductive contact 404 and the gallium nitride layer 104 (e.g., via PECVD, via spin-coating, via spray-coating, etc.) to facilitate passivation and isolation of the conductive contact 402 and the conductive contact 404 (e.g., passivation and isolation of p-electrodes and n-electrodes to prevent electrical short circuit). In an aspect, the passivation layer 106 can be deposited at least on a first set of conductive contacts (e.g., conductive contacts 402) associated with the one or more first recessed structures 202 and a second set of conductive contacts (e.g., conductive contacts 404) associated with the one or more second recessed structures 204. In a non-limiting example, the passivation layer 106 can comprise a thickness of 500 nm. However, it is to be appreciated that the passivation layer 106 can comprise a different thickness.

Figure 5B:
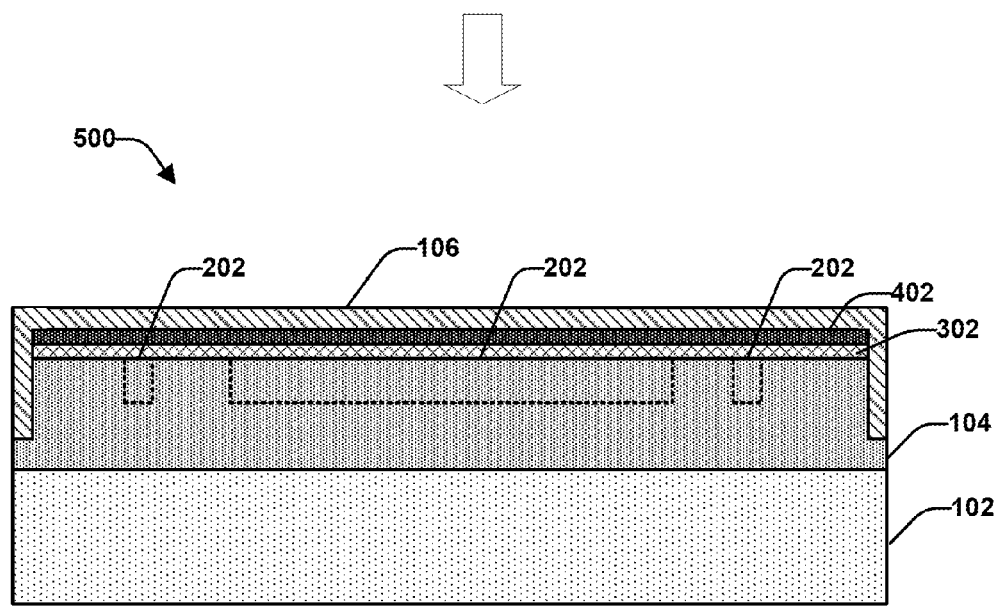
FIG. 5B presents an alternate cross-sectional view of the intermediate device structure presented in FIG. 5A, in accordance with one or more embodiments described herein.

Referring to FIG. 5B, presented is an alternate cross-sectional view of the intermediate device structure 500 that includes the substrate 102, the gallium nitride layer 104, the conductive layer 302, the conductive contact 402, and the passivation layer 106. The intermediate device structure 500 can be a next structure formed after the intermediate device structure 400 (e.g., in the process for fabricating the device 100). As illustrated by the alternate cross-sectional view of the intermediate device structure 500 presented in FIG. 5B, the passivation layer 106 can correspond to at least an entire width of the conductive contact 402.

Figure 6A:
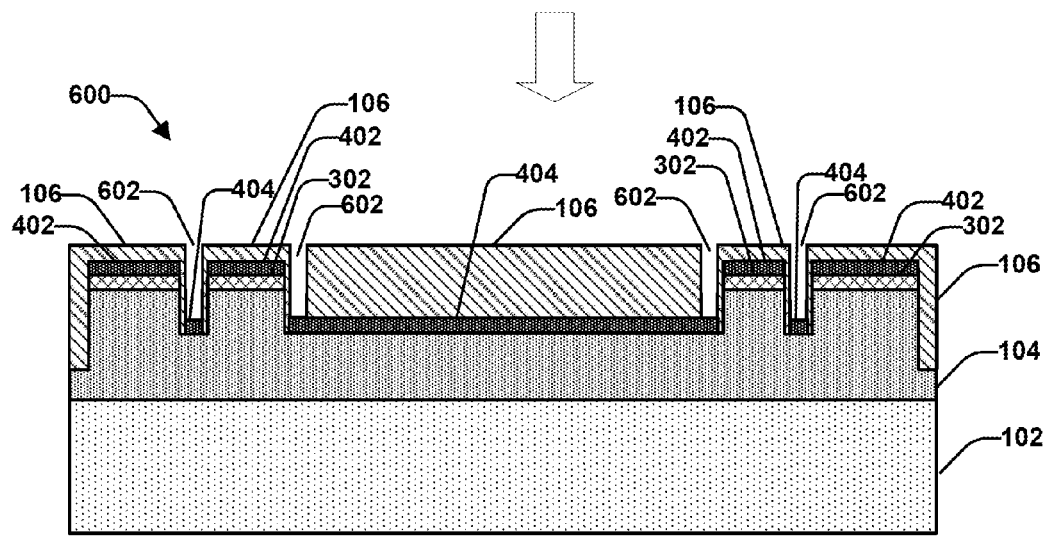
FIG. 6A presents a cross-sectional view of yet another example intermediate device structure associated with the process for fabricating the device, in accordance with one or more embodiments described herein.

Referring now to FIG. 6A, presented is a cross-sectional view of an intermediate device structure 600 that includes the substrate 102, the gallium nitride layer 104, the conductive layer 302, the conductive contact 402, the conductive contact 404, and the passivation layer 106. The intermediate device structure 600 can be a next structure formed after the intermediate device structure 500 (e.g., in the process for fabricating the device 100). One or more openings 602 can be formed in the passivation layer 106. For example, an opening 602 associated with each of the one or more first recessed structures 202 can be formed in the passivation layer 106. Additionally, at least one opening 602 associated with the one or more second recessed structures 204 can be formed in the passivation layer 106. The one or more openings 602 can be formed in the passivation layer 106 via a wet etching technique. For example, the one or more openings 602 can be formed in the passivation layer 106 via buffer oxide etchant (BOE) wet etching. Alternatively, the one or more openings 602 can be formed in the passivation layer 106 via a dry etching technique. In another example, the one or more openings 602 can be formed in the passivation layer 106 via a photolithography process. The openings 602 can be point-contacts (e.g., conductive contacts). In an aspect, the openings 602 can be n-type point-contacts that are distributed on the gallium nitride layer 104 (e.g., an n-type GaN layer). With the openings 602, a gallium nitride FCLED with improved current spreading, improved light extraction and improved light output power (LOP) can be provided. Furthermore, a gallium nitride FCLED with a shortened lateral current spreading distance can be achieved via the openings 602. Moreover, suppression of efficiency droop can also be achieved via the openings 602 (e.g., a uniform carrier distribution provided by the openings 602). Hence, overall series resistance and forward voltage can be reduced without negatively impacting a light-emitting portion of a gallium nitride FCLED.

Figure 6B:
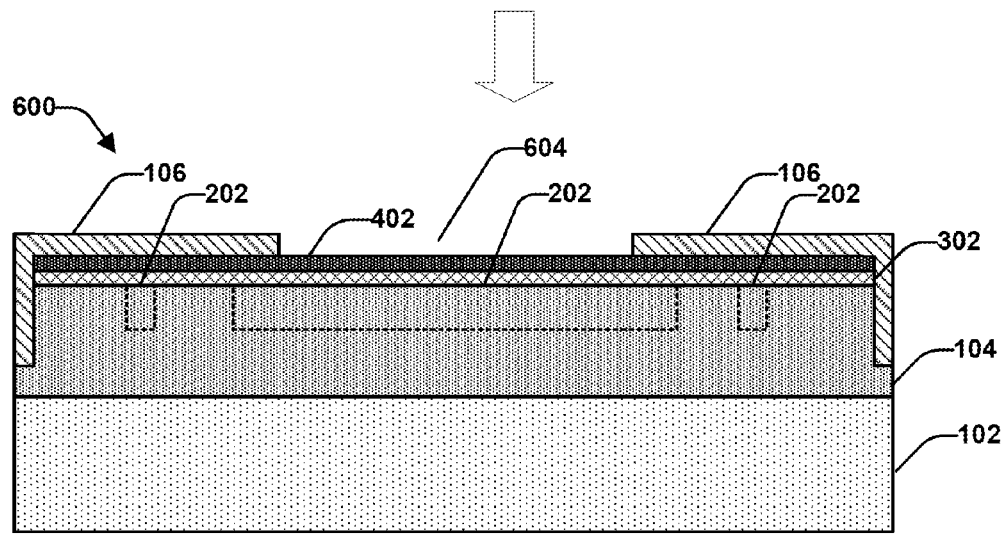
FIG. 6B presents an alternate cross-sectional view of the intermediate device structure presented in FIG. 6A, in accordance with one or more embodiments described herein.

Referring to FIG. 6B, presented is an alternate cross-sectional view of the intermediate device structure 600 that includes the substrate 102, the gallium nitride layer 104, the conductive layer 302, the conductive contact 402, the passivation layer 106, and the one or more openings 602. The intermediate device structure 600 can be a next structure formed after the intermediate device structure 500 (e.g., in the process for fabricating the device 100). Also, an opening 604 can be formed in the passivation layer 106. The opening 604 can be formed in the passivation layer 106 via a wet etching technique. For example, the opening 604 can be formed in the passivation layer 106 via BOE wet etching. Alternatively, the opening 604 can be formed in the passivation layer 106 via a dry etching technique. In another example, the opening 604 can be formed in the passivation layer 106 via a photolithography process.

Figure 7A:
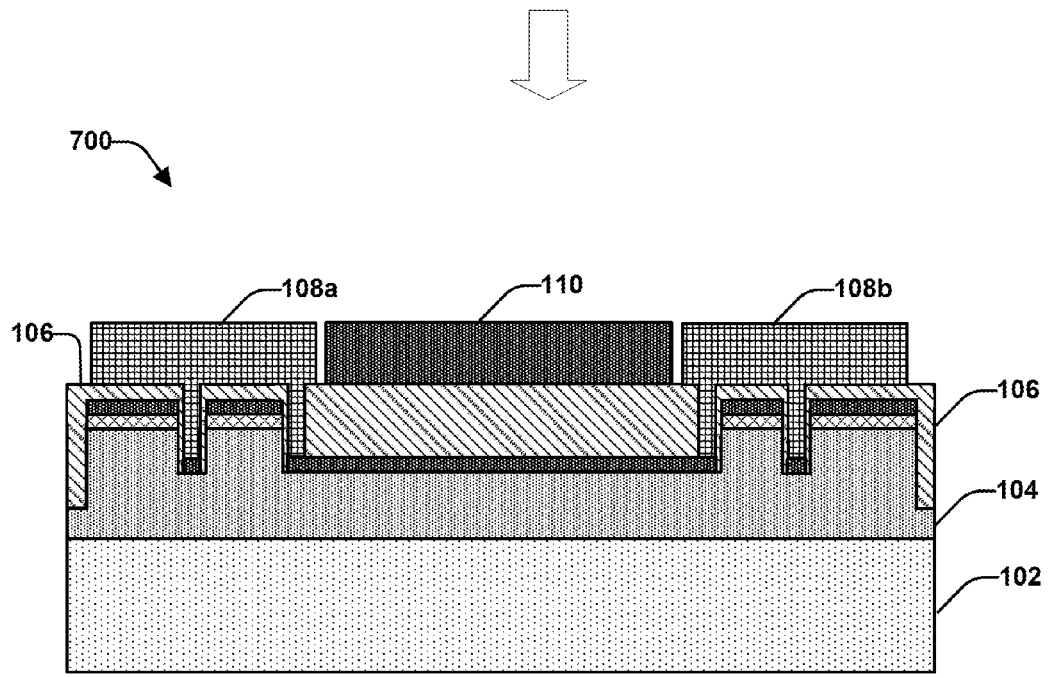
FIG. 7A presents a cross-sectional view of an example device structure associated with the process for fabricating the device, in accordance with one or more embodiments described herein.

Referring now to FIG. 7A, presented is a cross-sectional view of a device structure 700 that includes the substrate 102, the gallium nitride layer 104, the passivation layer 106, the conductive layer 302, the conductive contact 402, the conductive contact 404, the passivation layer 106, the one or more openings 602, the set of first conductive layers 108a-b, and the second conductive layer 110. The device structure 700 can be a next structure formed after the intermediate device structure 600 (e.g., in the process for fabricating the device 100). Furthermore, the device structure 700 can be a cross-sectional view of the device 100. The set of first conductive layers 108a-b can be formed on the passivation layer 106. Furthermore, the set of first conductive layers 108a-b can be associated with the one or more openings 602 related to the one or more first recessed structures 202 and/or the one or more second recessed structures 204. For example, the set of first conductive layers 108a-b can cover an opening 602 for each of the first set of conductive contacts (e.g., conductive contacts 402) associated with the one or more first recessed structures 202 and/or an opening 602 for each of the second set of conductive contacts (e.g., conductive contacts 404) associated with the one or more second recessed structures 204. In one example, the set of first conductive layers 108a-b can be a set of n-bumping layers. In an aspect, the set of first conductive layers 108a-b can be physically and electrically connected to the conductive contacts 402 and the conductive contacts 404 within the one or more first recessed structures 202 and/or the one or more second recessed structures 204 (e.g., via the one or more openings 602). The second conductive layer 110 can also be formed on the passivation layer 106. A portion of the passivation layer 106 can be formed between the second conductive layer 110 and the conductive contacts 404 (e.g., the second set of conductive contacts associated with the one or more second recessed structures 204). In the cross-sectional view of the device structure 700 shown in FIG. 7A, the second conductive layer 110 is not physically or electrically connected to the conductive contact 404. For example, the passivation layer 106 can be formed between the second conductive layer 110 and the conductive contact 404 (e.g., to prevent electrical short circuit). In one example, the second conductive layer 110 can be a p-bumping layer. In an aspect, the set of first conductive layers 108a-b can comprise a material that corresponds to a material of the conductive contact 404. Additionally, the second conductive layer 110 can comprise a material that corresponds to a material of the conductive contact 402 (e.g., a p-type conductive layer). In another aspect, the set of first conductive layers 108a-b and the second conductive layer 110 can be formed by evaporating one or more conductive layers (e.g., to facilitate connection of each n-type point-contact). For example, the set of first conductive layers 108a-b and the second conductive layer 110 can be formed by evaporating a first titanium layer, an aluminum layer, a second titanium layer and/or a gold layer.

Figure 7B:
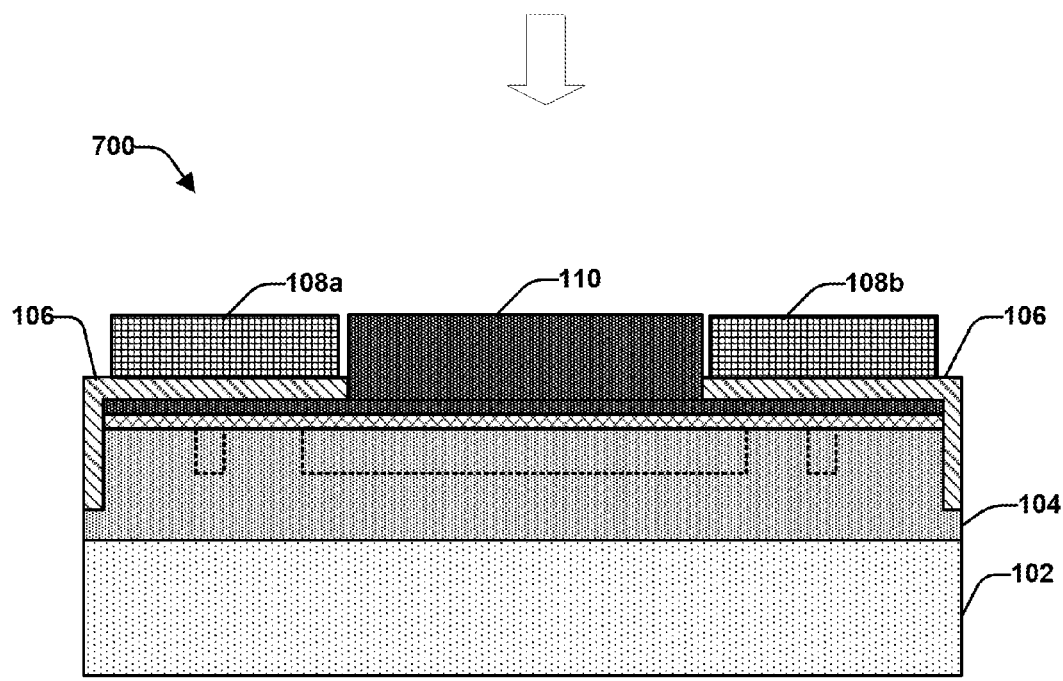
FIG. 7B presents an alternate cross-sectional view of the device structure presented in FIG. 7A, in accordance with one or more embodiments described herein.

Referring to FIG. 7B, presented is an alternate cross-sectional view of the device structure 700 that includes the substrate 102, the gallium nitride layer 104, the passivation layer 106, the conductive layer 302, the conductive contact 402, the conductive contact 404, the passivation layer 106, the opening 604, the set of first conductive layers 108a-b, and the second conductive layer 110. The intermediate device structure 700 can be a next structure formed after the intermediate device structure 600 (e.g., in the process for fabricating the device 100). The set of first conductive layers 108a-b can be formed on the passivation layer 106. In the alternate cross-sectional view of the device structure 700 shown in FIG. 7B, the set of first conductive layers 108a-b is not physically or electrically connected to the conductive contact 402. For example, the passivation layer 106 can be formed between the set of first conductive layer 108a-b and the conductive contact 402 (e.g., to prevent electrical short circuit). The second conductive layer 110 can be formed on the passivation layer 106 and/or can be associated with the opening 604. In the alternate cross-sectional view of the device structure 700 shown in FIG. 7B, the second conductive layer 110 can be physically and electrically connected to the conductive contact 402.

In certain implementations, the intermediate device structure 700 can undergo further processing. For example, the substrate 102 of the intermediate device structure 700 can undergo lapping and/or polishing to decrease a thickness of the substrate 102 (e.g., down to 100 μm). In another example, the intermediate device structure 700 can be flipped onto a submount (e.g., a silicon submount) that comprises aluminum interconnects and/or solder bumps (e.g., ball shaped indium bumps). In yet another example, the intermediate device structure 700 can undergo thermal-compression bonding via a flip-chip bonder to facilitate completion of a flip-chip process.

Figure 8:
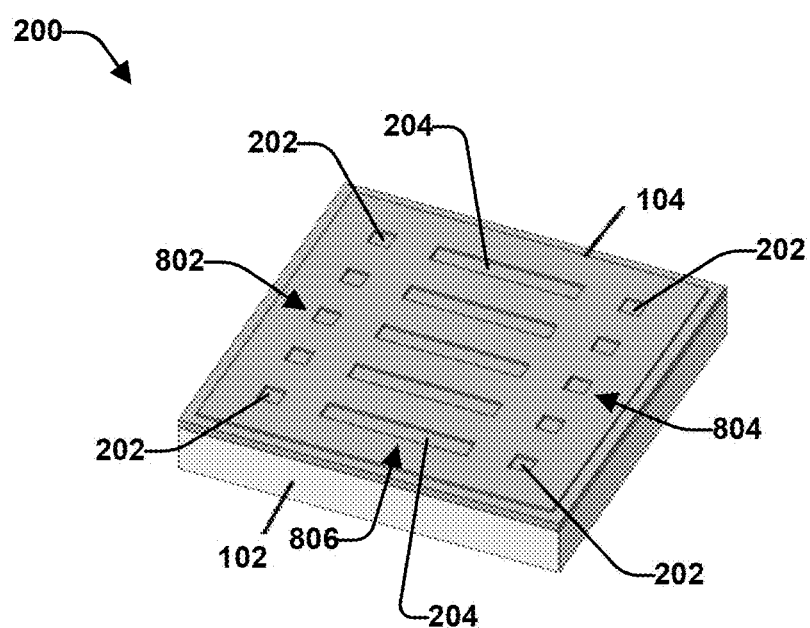
FIG. 8 presents a perspective view of the intermediate device structure presented in FIG. 2, in accordance with one or more embodiments described herein.

Referring now to FIG. 8, presented is a perspective view of the intermediate device structure 200 that includes the substrate 102 and the gallium nitride layer 104. As illustrated by FIG. 8, the gallium nitride layer 104 includes the one or more first recessed structures 202 and the one or more second recessed structures 204. In an aspect, the first recessed structures 202 can be associated with a first column 802 that includes a set of first recessed structures 202 (e.g., a set of first recessed structures 202 aligned in a straight line) and a second column 804 that includes another set of first recessed structures 202 (e.g., another set of first recessed structures 202 aligned in a straight line). In another aspect, the second recessed structures 204 can be associated with a single column 806 that includes the second recessed structures 204 (e.g., the second recessed structures 204 aligned in a straight line). The one or more first recessed structures 202 can be associated with a square-shaped recessed structure and the one or more second recessed structures 204 can be associated with a rectangular-shaped recessed structure.

Figure 9:
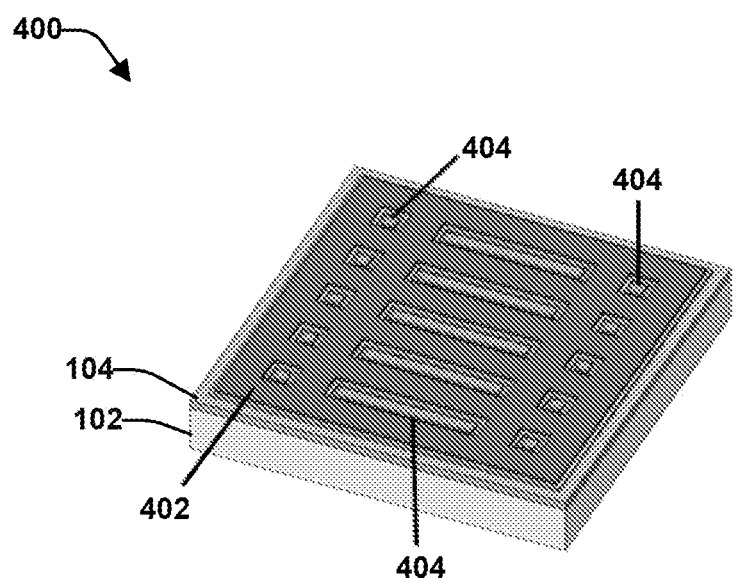
FIG. 9 presents a perspective view of the intermediate device structure presented in FIGS. 4A and 4B, in accordance with one or more embodiments described herein.

Referring now to FIG. 9, presented is a perspective view of the intermediate device structure 400 that includes the substrate 102, the gallium nitride layer 104, the conductive contact 402, and the conductive contact 404. As illustrated by FIG. 9, the conductive contact 402 can surround a plurality of portions of the conductive contact 404 associated with the first recessed structures 202 and the second recessed structures 204. For example, the conductive contact 402 can be formed on portions of the gallium nitride layer 104 that are not associated with the first recessed structures 202 and the second recessed structures 204.

Figure 10:
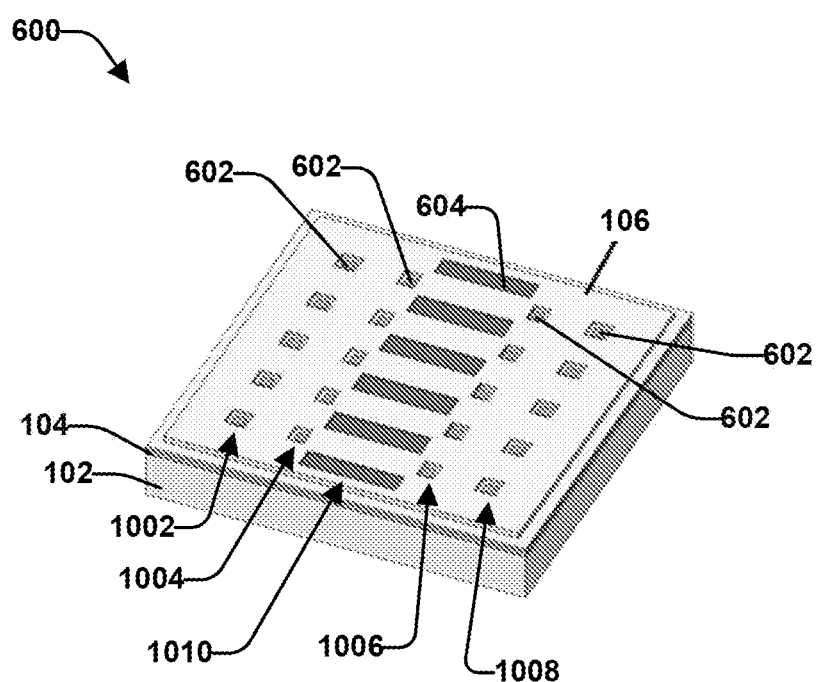
FIG. 10 presents a perspective view of the intermediate device structure presented in FIGS. 6A and 6B, in accordance with one or more embodiments described herein.

Referring now to FIG. 10, presented is a perspective view of the intermediate device structure 600 that includes the substrate 102, the gallium nitride layer 104, the passivation layer 106, the openings 602 and the openings 604. As illustrated by FIG. 10, the openings 602 can be associated with the conductive contact 404 and the openings 604 can be associated with the conductive contact 402. For example, the openings 602 and/or the openings 604 can be implemented as and/or can be associated with conductive contacts. In an aspect, the openings 602 can be associated with a first column 1002 that includes a first set of openings 602 (e.g., a set of openings 602 aligned in a straight line), a second column 1004 that includes a second set of openings 602 (e.g., another set of openings 602 aligned in a straight line), a third column 1006 that includes a third set of openings 602 (e.g., another set of openings 602 aligned in a straight line), and a fourth column 1008 that includes a fourth set of openings 602 (e.g., another set of openings 602 aligned in a straight line). However, it is to be appreciated that the openings 602 can be associated with a different number of columns. In another aspect, the openings 604 can be associated with a single column 1010 that includes a set of openings 604 (e.g., a set of openings 604 aligned in a straight line). In yet another aspect, the openings 602 can be offset from the openings 604 (e.g., a row of openings 602 can be offset from an opening 604).

The openings 602 can be implemented as point-contacts (e.g., etched holes). In one example, spacing between each of the openings 602 can be constant (e.g., the openings 602 can be uniformly distributed on a surface of the intermediate device structure 600). Furthermore, the openings 602 can form a contact array on a surface of the intermediate device structure 600 and/or can provide a minimized lateral current spreading distance. For example, the openings 604 can be formed between a first contact array of the openings 602 (e.g., a first contact array associated with the conductive layer 108a) and a second contact array of the openings 602 (e.g., a second contact array associated with the other conductive layer 108b). An effective light emission area associated with the intermediate device structure 600 can be greater than or equal to 85%. For example, the openings 602 can cover 5%-15% of a surface area associated with the intermediate device structure 600. In an implementation, the openings 602 can each be square-shaped with size that is less than or equal to 30 μm×30 μm (e.g., the openings 602 can each be a 10 μm×10 μm square-shaped opening, etc.). However, it is to be appreciated that the openings 602 can each include a different shape (e.g., a circle shape, a hexagonal shape, another shape, etc.). Deepness of the openings 602 can vary based on an epitaxial structure of the gallium nitride layer 104 on the substrate 102. In a non-limiting example, etching depth of the openings 602 and/or the openings 604 can be between a range from 0.4 nm to 2.5 μm.

Figure 11:
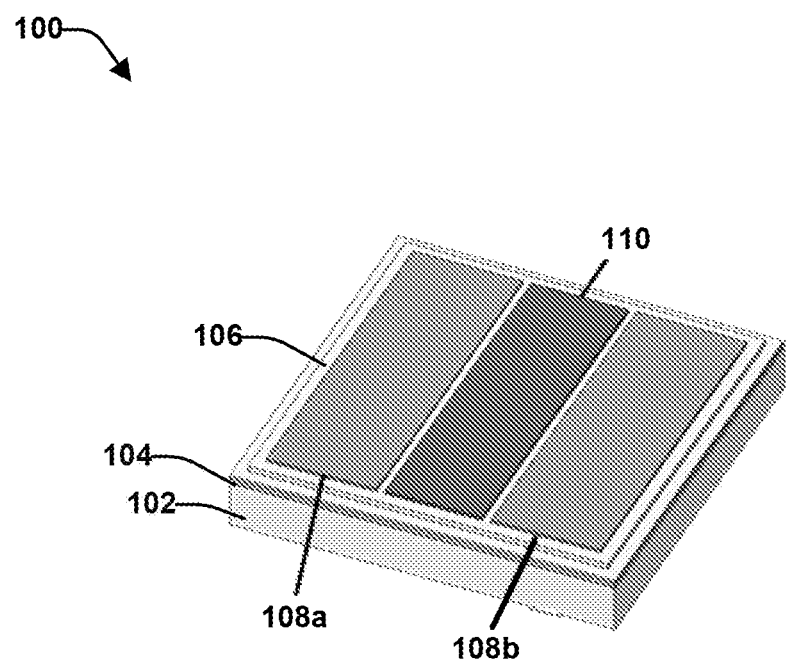
FIG. 11 presents a perspective view of an example device, in accordance with one or more embodiments described herein.

Referring now to FIG. 11, presented is a perspective view of the device 100 that includes the substrate 102, the gallium nitride layer 104, the passivation layer 106, the set of first conductive layers 108a-b, and the second conductive layer 110. As illustrated by FIG. 11, the openings 602 can be covered by the set of first conductive layers 108a-b and the openings 604 can be covered by the second conductive layer 110. Furthermore, the first conductive layer 108a and the other first conductive layer 108b can be separated by the second conductive layer 110. In an aspect, the first conductive layer 108a, the other first conductive layer 108b, and the second conductive layer 110 can each comprise a rectangular shape. The device 100 can be associated with higher LOP and WPE as compared to a conventional FCLED with conventional contacts. The device 100 can also be associated with lower forward voltage as compared to a conventional FCLED with conventional contacts. Moreover, the device 100 can be fabricated while minimizing fabrication process time and cost.

Figure 12:
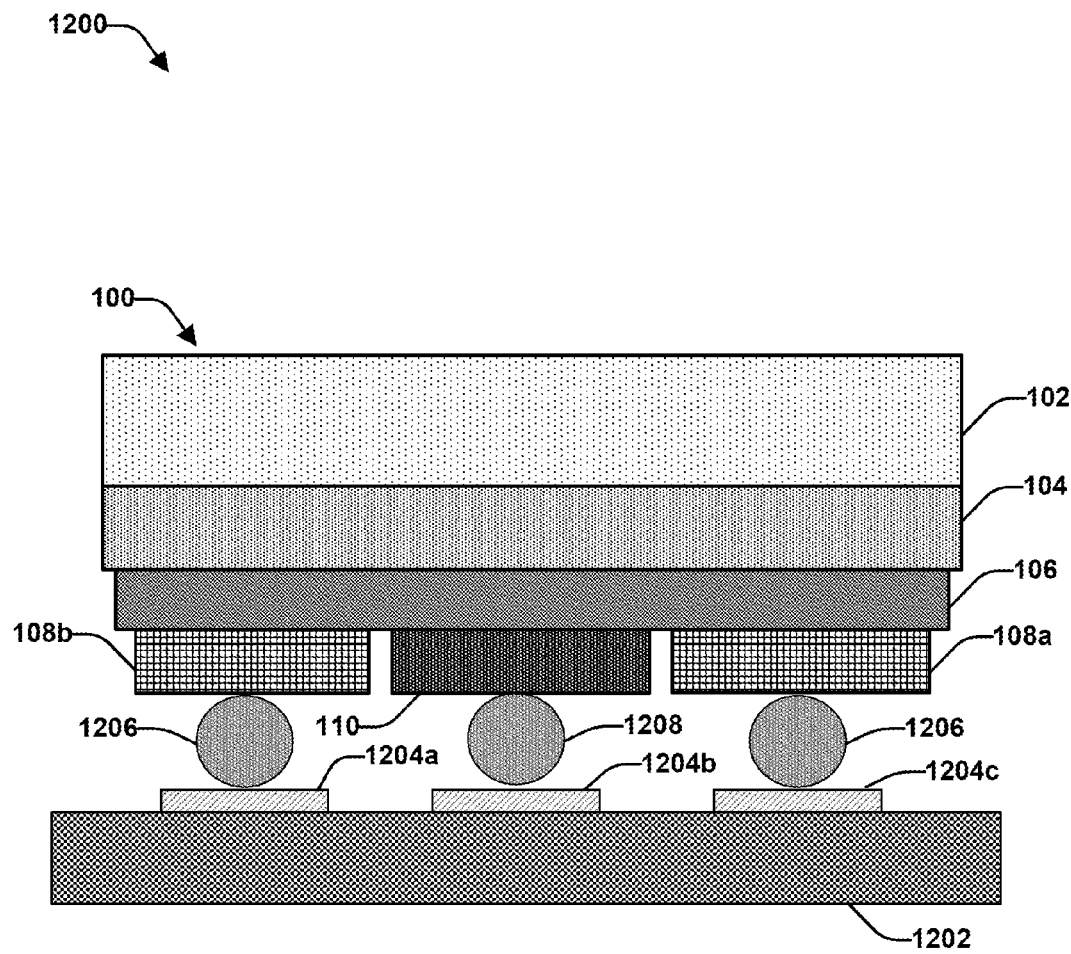
FIG. 12 presents an example system, in accordance with one or more embodiments described herein.

Referring now to FIG. 12, presented is a system 1200, in accordance with various embodiments. The system 1200 can be associated with a chip-on-board (COB) surface mount process. The system 1200 includes the device 100 and a device 1202. For example, the device 100 can be an LED device (e.g., a FCLED device, a PC-FCLED device, etc.) that includes the gallium nitride layer 104 formed on the substrate 102, the passivation layer 106 formed on the gallium nitride layer 104, the set of first conductive layers 108a-b formed on a portion of the passivation layer 106, and the second conductive layer 110 formed on another portion of the passivation layer 106. The set of first conductive layers 108a-b can correspond to a set of recesses (e.g., a first set of recesses and/or a second set of recesses) formed in the gallium nitride layer 104. The set of recesses can be associated with a first conductive material (e.g., an n-type electrode). The second conductive layer 110 can correspond to a second conductive material (e.g., a p-type electrode). The device 1202 can be a submount that can be bonded to the set of first conductive layers 108a-b and the second conductive layer 110. For example, the device 1202 can be bonded to the set of first conductive layers 108a-b and the second conductive layer 110 via a flip-chip bonder. In another example, the device 1202 can be bonded to the set of first conductive layers 108a-b and the second conductive layer 110 via thermal-compression bonding. In an aspect, a first conductive layer 1204a of the device 1202 can be bonded to the other first conductive layer 108b via a solder bump 1206 (e.g., one or more n-bumps), a second conductive layer 1204b of the device 1202 can be bonded to the second conductive layer 110 via a solder bump 1208 (e.g., one or more p-bumps), and a third conductive layer 1204c of the device 1202 can be bonded to the first conductive layer 108a via solder bump 1206 (e.g., one or more n-bumps). Each solder bump 106 can be, for example, an indium solder bump. In one example, the device 1202 can be a silicon substrate (e.g., a silicon device). In another example, the device 1202 can be an integrated chip (e.g., a complementary metal-oxide-semiconductor chip, etc.). In yet another example, the device 1202 can be associated with a printed circuit board. In yet another example, the device 1202 can be associated with a ceramic substrate. In certain implementations, the device 100 can further include a sapphire front surface (e.g., on a surface of the substrate 102 that is not associated with the gallium nitride layer 104). In another implementation, the device 100 can include the gallium nitride layer 104 without sapphire substrate 102.

Figure 13:
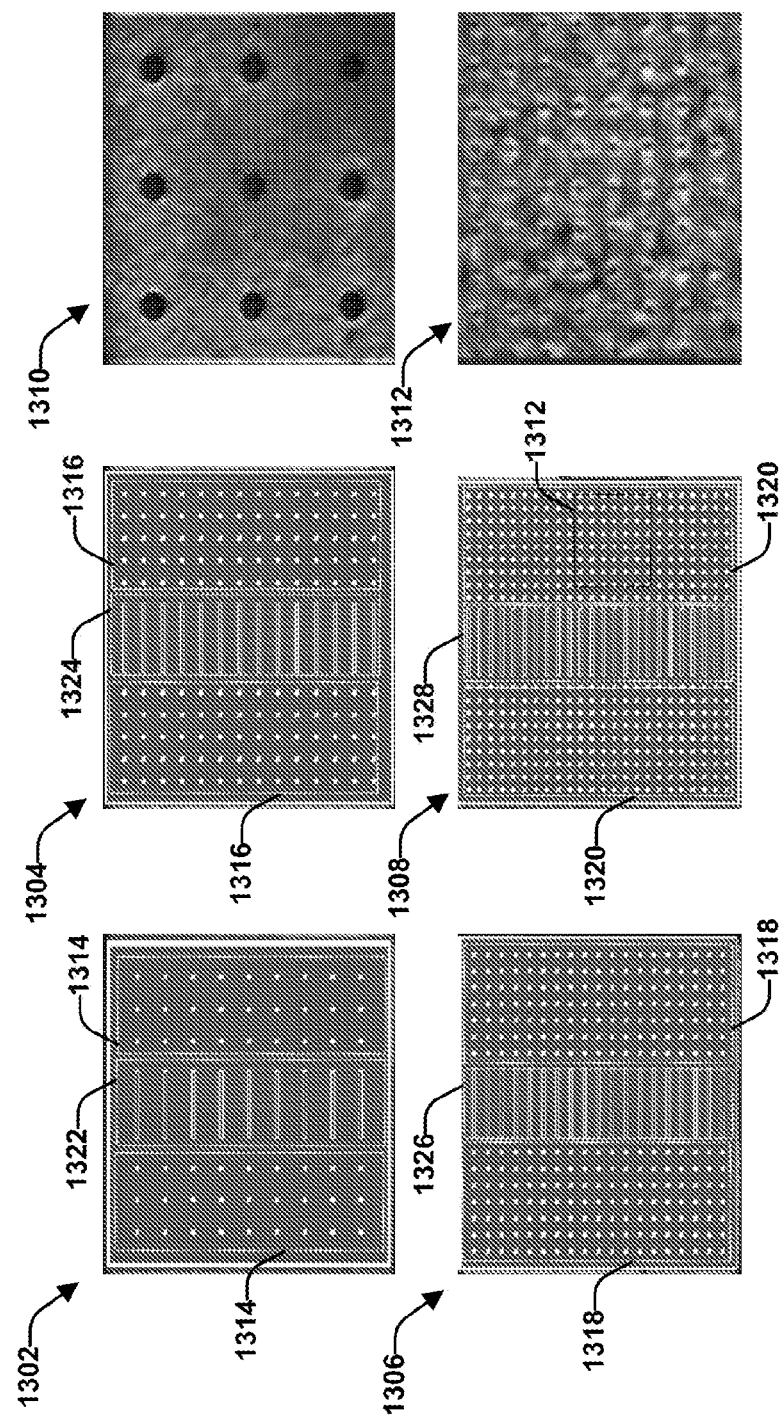
FIG. 13 presents multiple light emission images, in accordance with one or more embodiments described herein.

FIG. 13 illustrates light emission images associated with a FCLED, as disclosed herein. FIG. 13 includes a first light emission image 1302 associated with a first embodiment of a FCLED captured at 10 mA, a second light emission image 1304 associated with a second embodiment of a FCLED captured at 10 mA, a third light emission image 1306 associated with a third embodiment of a FCLED captured at 10 mA, and a fourth light emission image 1308 associated with a fourth embodiment of a FCLED captured at 10 mA. FIG. 13 also includes a fifth light emission image 1310 associated with a reference FCLED captured at 10 mA and a magnified view 1312 of point-contact holes (e.g., n-type point-contact holes) included in the fourth light emission image 1308. The reference FCLED can be a conventional FCLED with conventional contacts. Point-contact holes included in the first light emission image 1302 (e.g., at least point-contact holes 1314) include a 100 μm pitch, point-contact holes included in the second light emission image 1304 (e.g., at least point-contact holes 1316) include a 67 μm pitch, point-contact holes included in the third light emission image 1306 (e.g., at least point-contact holes 1318) include a 50 μm pitch, and point-contact holes included in the fourth light emission image 1308 (e.g., at least point-contact holes 1320) include a 40 μm pitch. Therefore, density of point-contact holes among the first light emission image 1302, the second light emission image 1304, the third light emission image 1306, and the fourth light emission image 1308 can vary. Point-contact holes included in the first light emission image 1302, the second light emission image 1304, the third light emission image 1306, and the fourth light emission image 1308 can include a same size.

In an aspect, point-contact holes included in the first light emission image 1302, the second light emission image 1304, the third light emission image 1306, and the fourth light emission image 1308 can correspond to the openings 602. As illustrated by the magnified view 1312 in FIG. 13, light emission is more intense in a vicinity associated with the point-contact holes. This is due to enhanced light extraction enabled by deep edges of the point-contact holes with respect to a flat gallium nitride surface. In addition, arrays of electrode stripes (e.g., n-type electrode stripes) are present in the first light emission image 1302, the second light emission image 1304, the third light emission image 1306, and the fourth light emission image 1308. For example, the first light emission image 1302 includes an array of electrode stripes 1322, the second light emission image 1304 includes an array of electrode stripes 1324, the third light emission image 1306 includes an array of electrode stripes 1326, and the fourth light emission image 1308 includes an array of electrode stripes 1328. The array of electrode stripes 1322, the array of electrode stripes 1324, the array of electrode stripes 1326, and the array of electrode stripes 1328 can correspond to the openings 604. An array of electrodes stripes (e.g., the array of electrode stripes 1322, etc.) can be employed to enhance current spreading in one or more regions that cannot be accessed by point-contact holes (e.g., point-contact holes 1314, etc.) due to coverage of a p-bumping layer (e.g., second conductive layer 110).

Figure 14:
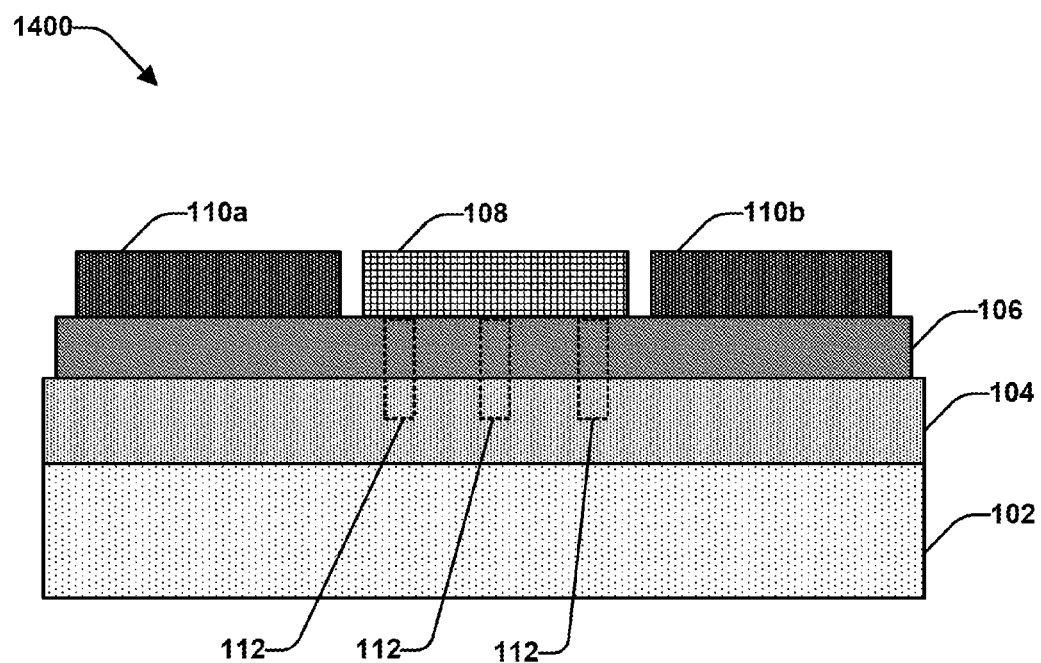
FIG. 14 presents a side view of another example device, in accordance with one or more embodiments described herein.

FIG. 14 presents a side view of an example device 1400 fabricated in accordance with one or more embodiments described herein. In one example, the device 1400 can be a gallium nitride FCLED. In another example, the device 1400 can be a PC-FCLED. The device 1400 can simultaneously provide high brightness and low voltage (e.g., lower operating voltage) as compared to a conventional FCLED. Furthermore, the device 1400 can be associated with higher efficiency, lower manufacturing cost and/or a longer lifespan as compared to a conventional FCLED. The device 1400 can be employed for various lighting applications, such as but not limited to, lighting for a display, LED light bulbs (e.g., high brightness LED light bulbs, etc.), LED bullets (e.g., low power LED bullets), other lighting applications, etc.

The device 1400 can include substrate 102, gallium nitride layer 104 and passivation layer 106. The gallium nitride layer 104 can be formed on the substrate 102. In one example, the substrate 102 can be a sapphire substrate. In another example, the substrate 102 can be a silicon substrate. In yet another example, the substrate 102 can be a silicon carbide substrate. In yet another example, the substrate 102 can be a gallium nitride substrate. However, it is to be appreciated that the substrate 102 can be a different type of substrate. Furthermore, the passivation layer 106 can be formed on the gallium nitride layer 104. In one example, the passivation layer 106 can be an oxide layer (e.g., a silicon dioxide layer). In another example, the passivation layer 106 can be a nitride layer. In yet another example, the passivation layer 106 can be a polymer layer. In another example, the passivation layer 106 can be a polyimide layer. The device 1400 can also include first conductive layer 108 and set of second conductive layers 110a-b (e.g., a second conductive layer 110a and another second conductive layer 110b). The first conductive layers 108 and/or the set of second conductive layers 110a-b can be formed on the passivation layer 106. Furthermore, the first conductive layer 108 can be implemented between the second conductive layer 110a and the other second conductive layer 110b. In an implementation, a phosphor film can be applied to a surface of the substrate 102 (e.g., a surface of the substrate 102 that is not associated with the gallium nitride layer 104).

In an aspect, the gallium nitride layer 104 can be associated with plurality of recesses 112 associated with a first structure. For example, the plurality of recesses 112 can be a plurality of recessed structures. Additionally or alternatively, the passivation layer 106 can be associated with the plurality of recesses 112. The plurality of recesses 112 can be associated with a first conductive material. The first conductive layer 108 can correspond to the first conductive material (e.g., an n-type electrode). Additionally, the set of second conductive layers 110a-b can correspond to a second conductive material (e.g., a p-type electrode). In certain implementations, the first conductive layer 108 and the set of second conductive layers 110a-b can be bonded to another substrate (e.g., another device). For example, the first conductive layer 108 and the set of second conductive layers 110a-b can be soldered to another substrate (e.g., another device). In one example, the other substrate (e.g., the other device) bonded to the first conductive layer 108 and the set of second conductive layers 110a-b can be an integrated chip.

Figure 15:
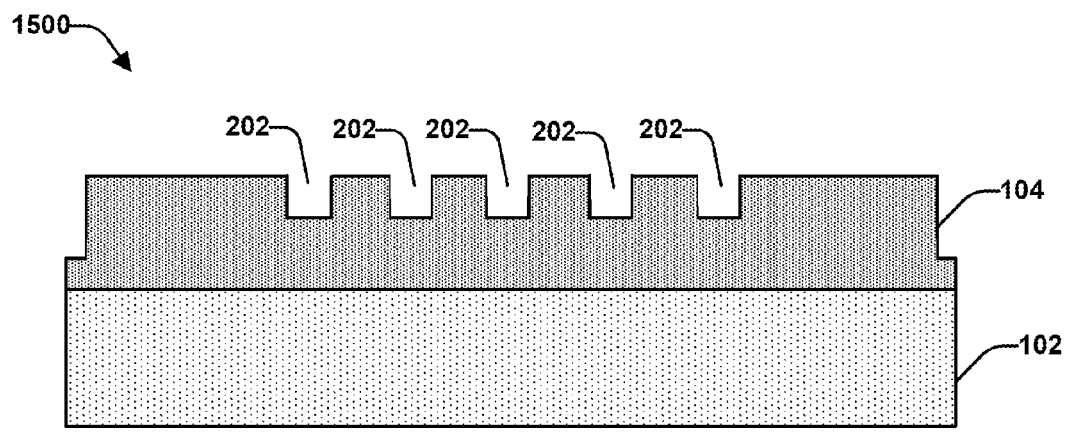
FIG. 15 presents a cross-sectional view of an example intermediate device structure associated with a process for fabricating another device, in accordance with one or more embodiments described herein.

FIGS. 15-20 pictorially depict an example process for fabricating the device 1400 (e.g., a gallium nitride FCLED, a PC-FCLED, etc.). Repetitive description of like elements employed in other embodiments described herein is omitted for sake of brevity. With reference to FIG. 15 presented is a cross-sectional view of an intermediate device structure 1500 that includes the substrate 102 and the gallium nitride layer 104. In one example, the intermediate device structure 1500 can be associated with n-contact definitions. The gallium nitride layer 104 can be associated with a GaN epitaxial wafer. Furthermore, the gallium nitride layer 104 can be formed on the substrate 102 via chemical vapor deposition. In one example, the gallium nitride layer 104 can be a GaN epitaxial layer (e.g., a blue LED GaN epitaxial layer) that is formed on (e.g., grown on) the substrate 102 via MOCVD. The gallium nitride layer 104 can be, for example, an n-type gallium nitride layer. In a non-limiting example, the gallium nitride layer 104 can comprise a peak emission wavelength of 450 nm. However, it is to be appreciated that the gallium nitride layer 104 can comprise a different peak emission wavelength. In another non-limiting example, the gallium nitride layer 104 can be a 1×1 mm$^2$ LED mesa structure. However, it is to be appreciated that the gallium nitride layer 104 can comprise a different size and/or structure.

In an aspect, the gallium nitride layer 104 can include one or more first recessed structures 202. The one or more first recessed structures 202 can be one or more point-contact holes. In a non-limiting example, a first recessed structure 202 can be an 11×11 μm$^2$ point-contact hole. However, it is to be appreciated that a first recessed structure 202 can comprise a different size. The one or more first recessed structures 202 can be patterned by photolithography. For example, the one or more first recessed structures 202 can be formed based on a pattern formed by photolithography. Furthermore, the one or more first recessed structures 202 can be etched via ICP etching.

Figure 16:
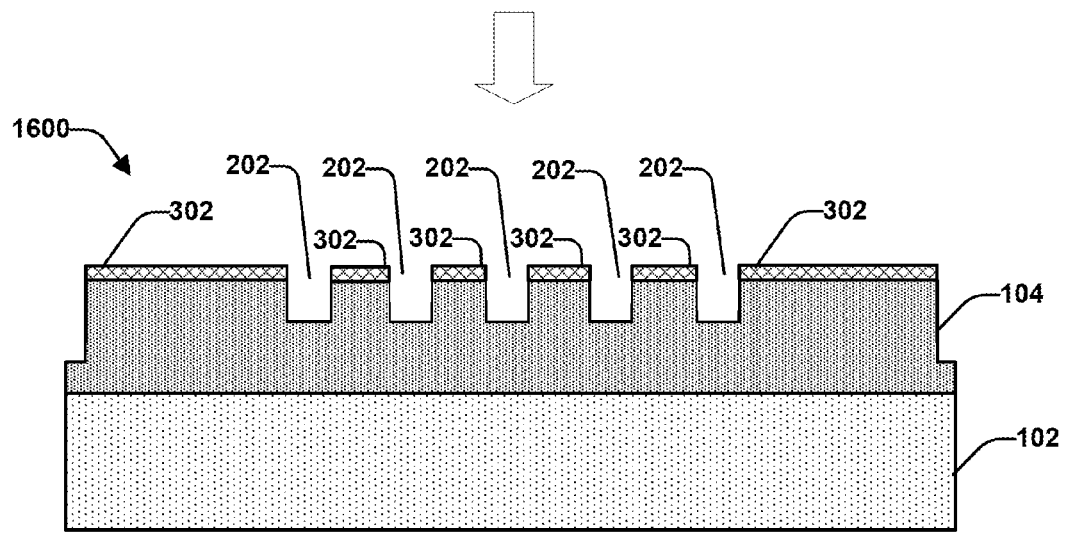
FIG. 16 presents a cross-sectional view of another example intermediate device structure associated with the process for fabricating the other device, in accordance with one or more embodiments described herein.

Referring now to FIG. 16, presented is a cross-sectional view of an intermediate device structure 1600 that includes the substrate 102, the gallium nitride layer 104, and conductive layer 302. The intermediate device structure 1600 can be a next structure formed after the intermediate device structure 1500 (e.g., in the process for fabricating the device 1400). The conductive layer 302 can be formed on the gallium nitride layer 104 via electron beam evaporation. Furthermore, the conductive layer 302 can be a conductive oxide layer (e.g., an indium tin oxide layer, etc.). In another example, the conductive layer 302 can be a metal layer (e.g., nickel, gold, silver, another alloy, etc.). In a non-limiting example, the conductive layer 302 can comprise a thickness of 115 nm. However, it is to be appreciated that the conductive layer 302 can comprise a different thickness. The conductive layer 302 can be deposited on a p-type gallium nitride surface of the gallium nitride layer 104. In an implementation, the intermediate device structure 300 can undergo an annealing process at an atmospheric ambient pressure at a defined temperature and/or for a defined amount of time. In a non-limiting example, the intermediate device structure 1600 can undergo an annealing process at an atmospheric ambient pressure at 600° C. for 5 minutes. However, it is to be appreciated that temperature and/or time for an annealing process associated with the intermediate device structure 1600 can be varied.

Figure 17:
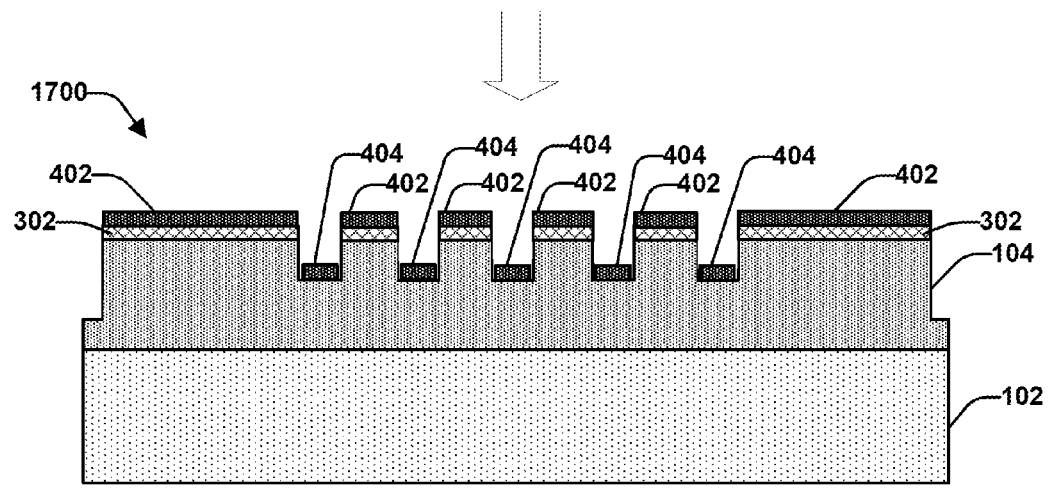
FIG. 17 presents a cross-sectional view of yet another example intermediate device structure associated with the process for fabricating the other device, in accordance with one or more embodiments described herein.

Referring now to FIG. 17, presented is a cross-sectional view of an intermediate device structure 1700 that includes the substrate 102, the gallium nitride layer 104, conductive layer 302, conductive contact 402 (e.g., conductive layer 402), and conductive contact 404 (e.g., conductive layer 404). In an aspect, the conducive contact 402 (e.g., the conductive layer 402) can be associated with a set of conductive contacts 402 (e.g., a set of conductive layer 402).

Additionally or alternatively, the conducive contact 404 (e.g., the conductive layer 404) can be associated with a set of conductive contacts 404 (e.g., a set of conductive layer 404). The intermediate device structure 1700 can be a next structure formed after the intermediate device structure 1600 (e.g., in the process for fabricating the device 1400). The conductive contact 402 and/or the conductive contact 404 can be formed by evaporating one or more conductive layers (e.g., one or more conductive layers associated with the conductive layer 302, a set of conductive contacts associated with the one or more first recessed structures 202, etc.). For example, the conductive contact 402 and/or the conductive contact 404 can be formed by evaporating a chromium layer, an aluminum layer, a titanium layer and/or a gold layer. The conductive contact 402 can be a p-type conductive contact. For example, the conductive contact 402 can be a reflective p-type metal contact. The conductive contact 404 can be an n-type conductive contact. For example, the conductive contact 404 can be an n-type contact (e.g., an n-type electrode). Each of the one or more first recessed structures 202 can be associated with the conductive contact 404. In an aspect, the conductive contact 404 can facilitate formation of a first set of conductive contacts associated with the one or more first recessed structures 202.

Figure 18:
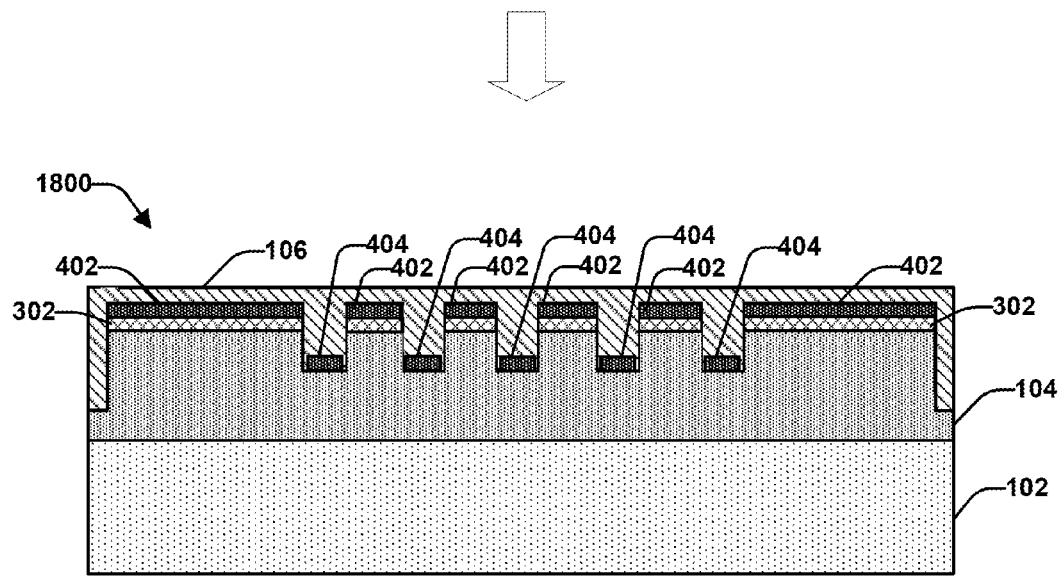
FIG. 18 presents a cross-sectional view of yet another example intermediate device structure associated with the process for fabricating the other device, in accordance with one or more embodiments described herein.

Referring now to FIG. 18, presented is a cross-sectional view of an intermediate device structure 1800 that includes the substrate 102, the gallium nitride layer 104, the conductive layer 302, the conductive contact 402, the conductive contact 404, and the passivation layer 106. The intermediate device structure 1800 can be a next structure formed after the intermediate device structure 1700 (e.g., in the process for fabricating the device 1400). The passivation layer 106 can be deposited on the conductive contact 402, the conductive contact 404 and the gallium nitride layer 104. For example, the passivation layer 106 can be deposited on the conductive contact 402, the conductive contact 404 and the gallium nitride layer 104 via PECVD. In another example, the passivation layer 106 can be deposited on the conductive contact 402, the conductive contact 404 and the gallium nitride layer 104 via spin-coating. In yet another example, the passivation layer 106 can be deposited on the conductive contact 402, the conductive contact 404 and the gallium nitride layer 104 via spray-coating. The passivation layer 106 can be deposited on the conductive contact 402, the conductive contact 404 and the gallium nitride layer 104 (e.g., via PECVD, via spin-coating, spray-coating, etc.) to facilitate passivation and isolation of the conductive contact 402 and the conductive contact 404 (e.g., passivation and isolation of p-electrodes and n-electrodes). In an aspect, the passivation layer 106 can be deposited at least on the conductive contact 404 (e.g., the first set of conductive contacts) associated with the one or more first recessed structures 202. In a non-limiting example, the passivation layer 106 can comprise a thickness of 500 nm. However, it is to be appreciated that the passivation layer 106 can comprise a different thickness.

Figure 19:
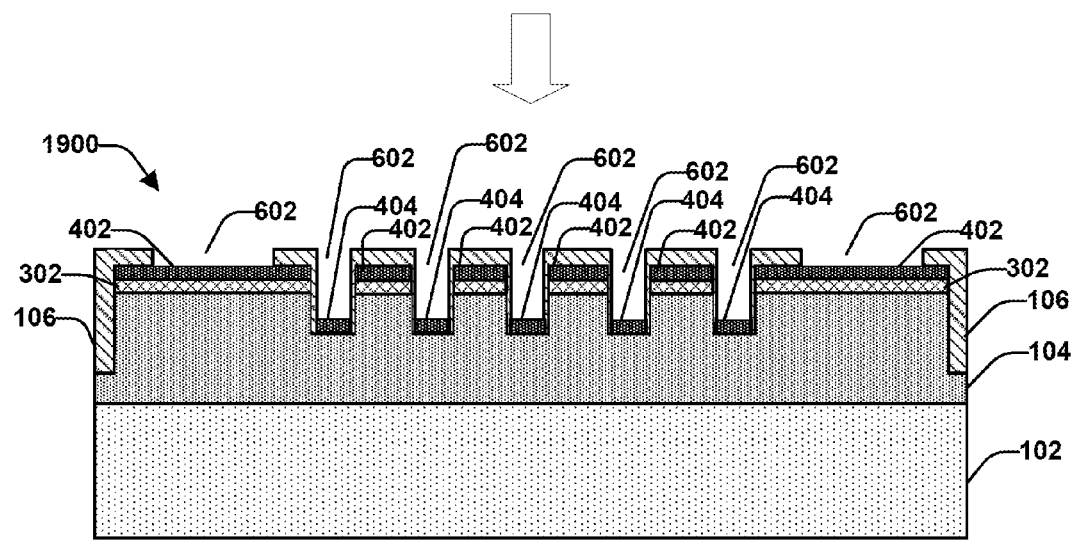
FIG. 19 presents a cross-sectional view of yet another example intermediate device structure associated with the process for fabricating the other device, in accordance with one or more embodiments described herein.

Referring now to FIG. 19, presented is a cross-sectional view of an intermediate device structure 1900 that includes the substrate 102, the gallium nitride layer 104, the conductive layer 302, the conductive contact 404, and the passivation layer 106. The intermediate device structure 1900 can be a next structure formed after the intermediate device structure 1800 (e.g., in the process for fabricating the device 1400). One or more openings 602 can be formed in the passivation layer 106. For example, an opening 602 associated with each of the one or more first recessed structures 202 (e.g., the conductive contact 404) can be formed in the passivation layer 106. Additionally, one or more openings 602 associated with the conductive contact 402 can be formed. The one or more openings 602 can be formed in the passivation layer 106 via a wet etching technique. For example, the one or more openings 602 can be formed in the passivation layer 106 via BOE wet etching. Alternatively, the one or more openings 602 can be formed in the passivation layer 106 via a dry etching technique. In an aspect, the openings 602 associated with each of the one or more first recessed structures 202 can be n-type point-contacts that are distributed on the gallium nitride layer 104 (e.g., an n-type GaN layer). With the openings 602, a gallium nitride FCLED with improved current spreading, improved light extraction and improved LOP can be provided. Furthermore, a gallium nitride FCLED with a shortened lateral current spreading distance can be achieved via the openings 602. Moreover, suppression of efficiency droop can also be achieved via the openings 602 (e.g., a uniform carrier distribution provided by the openings 602). Hence, overall series resistance and forward voltage can be reduced without negatively impacting a light-emitting portion of a gallium nitride FCLED.

Figure 20:
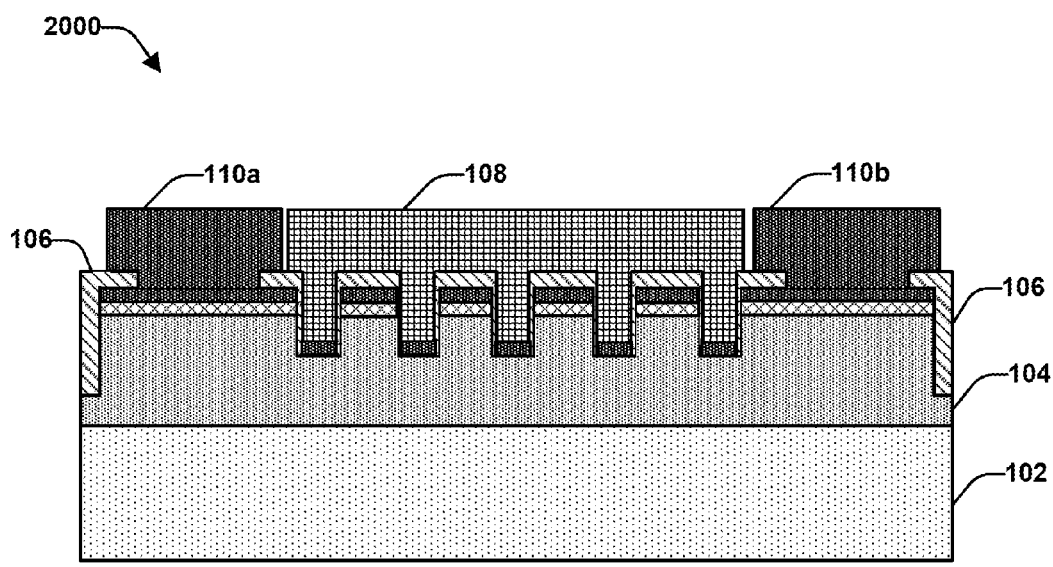
FIG. 20 presents a cross-sectional view of an example device structure associated with the process for fabricating the other device, in accordance with one or more embodiments described herein.

Referring now to FIG. 20, presented is a cross-sectional view of a device structure 2000 that includes the substrate 102, the gallium nitride layer 104, the conductive layer 302, the conductive contact 402, the conductive contact 404, the passivation layer 106, the one or more openings 602, the first conductive layer 108, and the set of second conductive layers 110a-b. The device structure 2000 can be a next structure formed after the intermediate device structure 1900 (e.g., in the process for fabricating the device 1400). Furthermore, the device structure 2000 can be a cross-sectional view of the device 1400. The first conductive layer 108 can be formed on the passivation layer 106. Furthermore, the first conductive layer 108 can be associated with the one or more openings 602 related to the conductive contact 404. For example, the first conductive layer 108 can cover an opening 602 for each of the first set of conductive contacts associated with the one or more first recessed structures 202. In one example, the first conductive layer 108 can be an n-bumping layer. In an aspect, the first conductive layer 108 can be physically and electrically connected to the conductive contact 404 within the one or more first recessed structures 202 (e.g., via the one or more openings 602). The set of second conductive layers 110a-b can also be formed on the passivation layer 106. Furthermore, the set of second conductive layers 110a-b can be associated with the openings 602 associated with the conductive contact 402. In one example, the set of second conductive layers 110a-b can be a p-bumping layer. In an aspect, the first conductive layer 108 can comprise a material that corresponds to a material of the conductive contact 404. Additionally, the set of second conductive layers 110a-b can comprise a material that corresponds to a material of the conductive contact 402. In another aspect, the first conductive layer 108 and the set of second conductive layers 110a-b can be formed by evaporating one or more conductive layers (e.g., to facilitate connection of each n-type point-contact). For example, the first conductive layer 108 and the set of second conductive layers 110a-b can be formed by evaporating a first titanium layer, an aluminum layer, a second titanium layer and/or a gold layer.

In certain implementations, the device structure 2000 can undergo further processing. For example, the substrate 102 of the intermediate device structure 700 can undergo lapping and/or polishing to decrease a thickness of the substrate 102 (e.g., down to 100 μm). In another example, the device structure 2000 can be flipped onto a submount (e.g., a silicon submount) that comprises aluminum interconnects and/or solder bumps (e.g., ball shaped indium bumps). In yet another example, the device structure 2000 can undergo thermal-compression bonding via a flip-chip bonder to facilitate completion of a flip-chip process.

Figure 21:
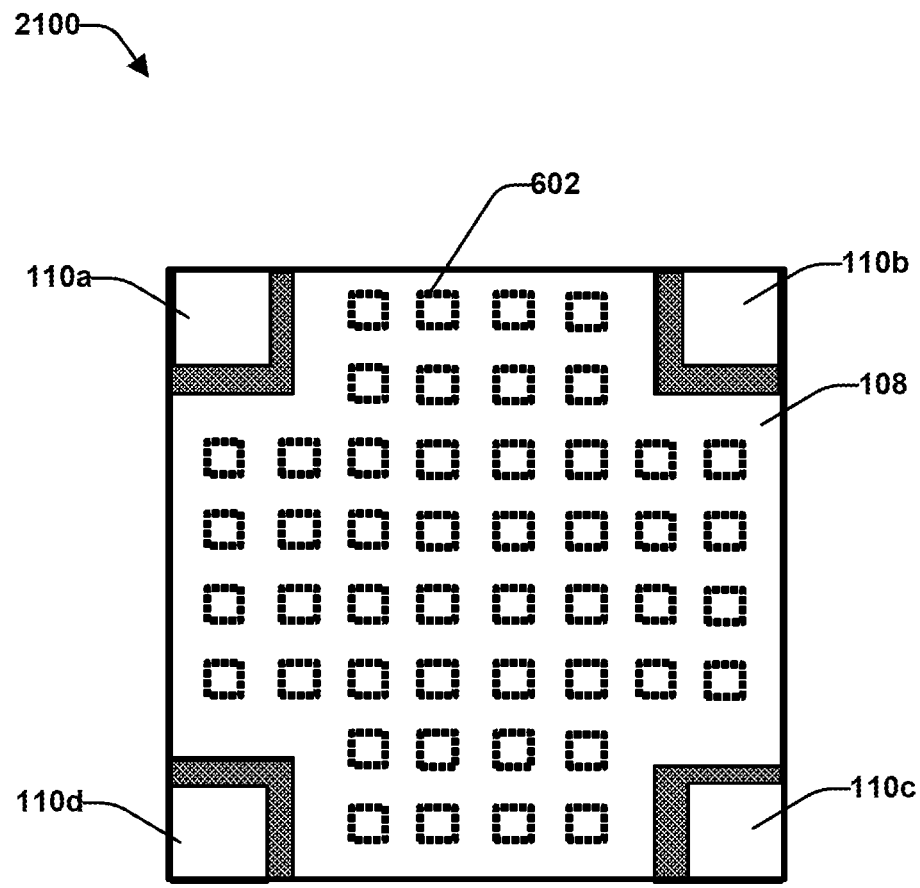
FIG. 21 presents a surface of the other device, in accordance with one or more embodiments described herein.

Referring to FIG. 21, presented is a surface 2100 of the device 1400. The surface 2100 of the device 1400 includes the first conductive layer 108 and the set of second conductive layers 110a-b. The surface 2100 of the device 1400 also includes a set of second conductive layers 110c-d. The first conductive layer 108 can be a single n-type electrode. The first conductive layer 108 can cover each of the openings 602 (e.g., the first conductive layer 108 can cover each of the point-contacts of the device 1400). The set of second conductive layers 110a-d can be a four p-type electrodes (e.g., near four corners of the surface 2100). The openings 602 can form a contact array (e.g., a cross-shaped contact array).

Figures 22A, 22B:
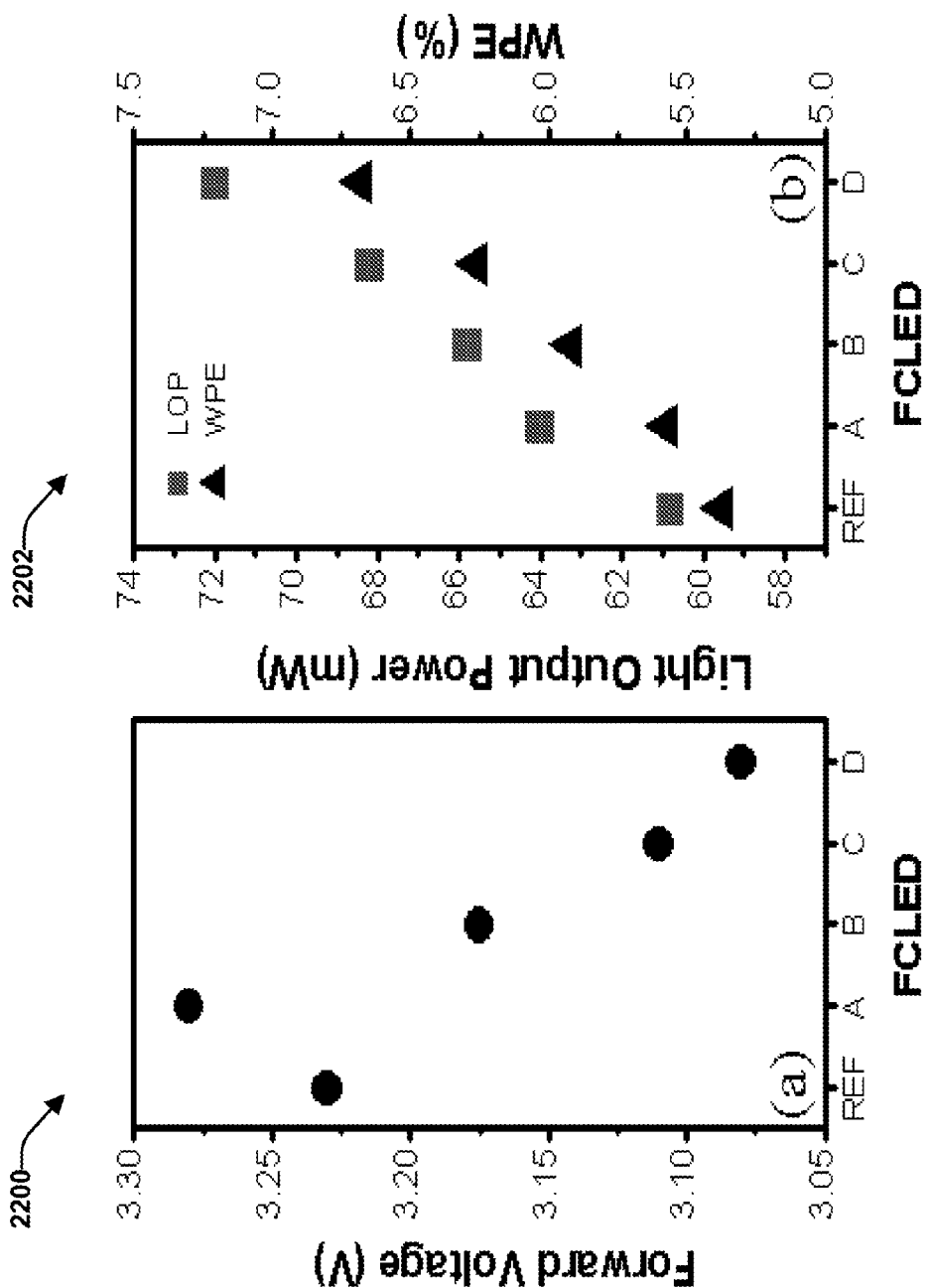
FIG. 22A presents a graph associated with forward voltage, in accordance with one or more embodiments described herein.
FIG. 22B presents a graph associated with light output power (LOP) and wall-plug efficiency (WPE), in accordance with one or more embodiments described herein.
Figure 23:
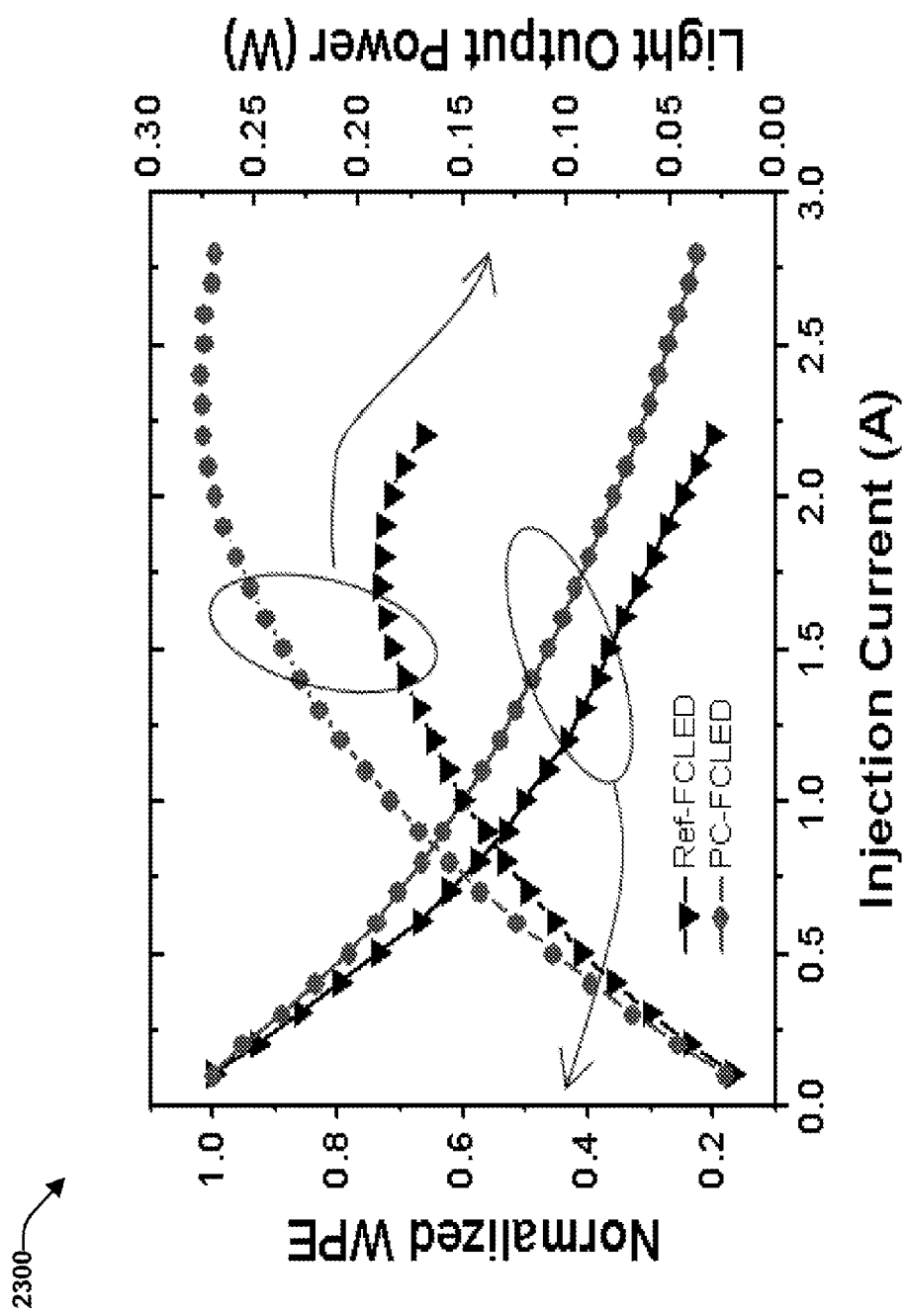
FIG. 23 presents a graph illustrating a comparison of light-current (L-I) curves and normalized WPE, in accordance with one or more embodiments described herein.

FIG. 22-23 provide experimental data demonstrating superior characteristics of a device (e.g., device 100, device 1400, etc.), as disclosed herein. Repetitive description of like elements employed in other embodiments described herein is omitted for sake of brevity. FIG. 22A provides a graph 2200 associated with forward voltage for a ref-FCLED and a plurality of PC-FCLEDs A-D measured at 350 mA. The PC-FCLED A corresponds to the first light emission image 1202, the PC-FCLED B corresponds to the second light emission image 1204, the PC-FCLED C corresponds to the third light emission image 1206, the PC-FCLED D corresponds to the first light emission image 1202, and the ref-FCLED corresponds to the fifth light emission image 1210. As illustrated by FIG. 22A, the PC-FCLEDs B-D comprise a lower forward voltage than the ref-FCLED. The PC-FCLED B, although having a slightly smaller total n-contact area than the ref-FCLED, exhibits a forward voltage lower than the ref-FCLED. As further illustrated by FIG. 22A, forward voltage drops further as number of point-contact increases. In particular, the forward voltage of PC-FCLED D is as low as 3.07 V at 350 mA, which is 0.16 V lower than the ref-FCLED. As such, reducing size of electrodes to form high-density point contacts (e.g., breaking down large electrodes into high-density point contacts) can reduce series resistance by shortening lateral current spreading distance. PC-FCLED A has the highest forward voltage due to a reduced n-contact area associated with the PC-FCLED A.

FIG. 22B provides a graph 2202 associated with light output power (LOP) and wall-plug efficiency (WPE) for the ref-FCLED and the plurality of PC-FCLEDs A-D measured at 350 mA. As illustrated by FIG. 22B, each of the PC-FCLEDs A-D is associated with higher LOP and WPE than the ref-FCLED. For example, the LOP of the PC-FCLED D is 72 mW at 350 mA, which is 18% more optical output power compared with the ref-FCLED. The WPE of the PC-FCLED D is increased by 24% when compared to the ref-FCLED at the same current level. Increase of the LOP and WPE can be attributed to, for example improvement of light extraction via a large number of n-type point-contact holes, a more uniform carrier distribution on a PC-FCLED via high density n-type point-contacts, and/or a shortened lateral current spreading distance.

FIG. 23 provides a graph 2300 illustrating a comparison of light-current (L-I) curves and normalized WPE of the PC-FCLED D and the ref-FCLED. The L-I curves of the PC-FCLED D and the ref-FCLED shown in the graph 2300 of FIG. 23 were measured by pulsed current input to minimize heat generation. As illustrated by FIG. 23, while LOP of the ref-FCLED saturates at 1.8 A, LOP of the PC-FCLED D can be increased to over 2.4 A before the LOP peaks at 278 mW. As such, the PC-FCLED D can achieve an LOP that is 43% higher than a maximum LOP of ref-FCLED. Comparing normalized WPE, the PC-FCLED D exhibits lower efficiency droop. As further illustrated by FIG. 23, the ref-FCLED is associated with 75% WPE degradation from 100 mA to 2 A, whereas the PC-FCLED D is associated with 64% WPE degradation from 100 mA to 2 A. This efficiency droop reduction can be attributed to uniform carrier distribution, which can effectively suppress a local Auger recombination and/or carrier overflow in an active region. As such, PC-FCLEDs A-D can provide improvements to various power applications, such as, for example, lighting applications, power applications (e.g., ultra-high power applications, etc.).

Figure 24:
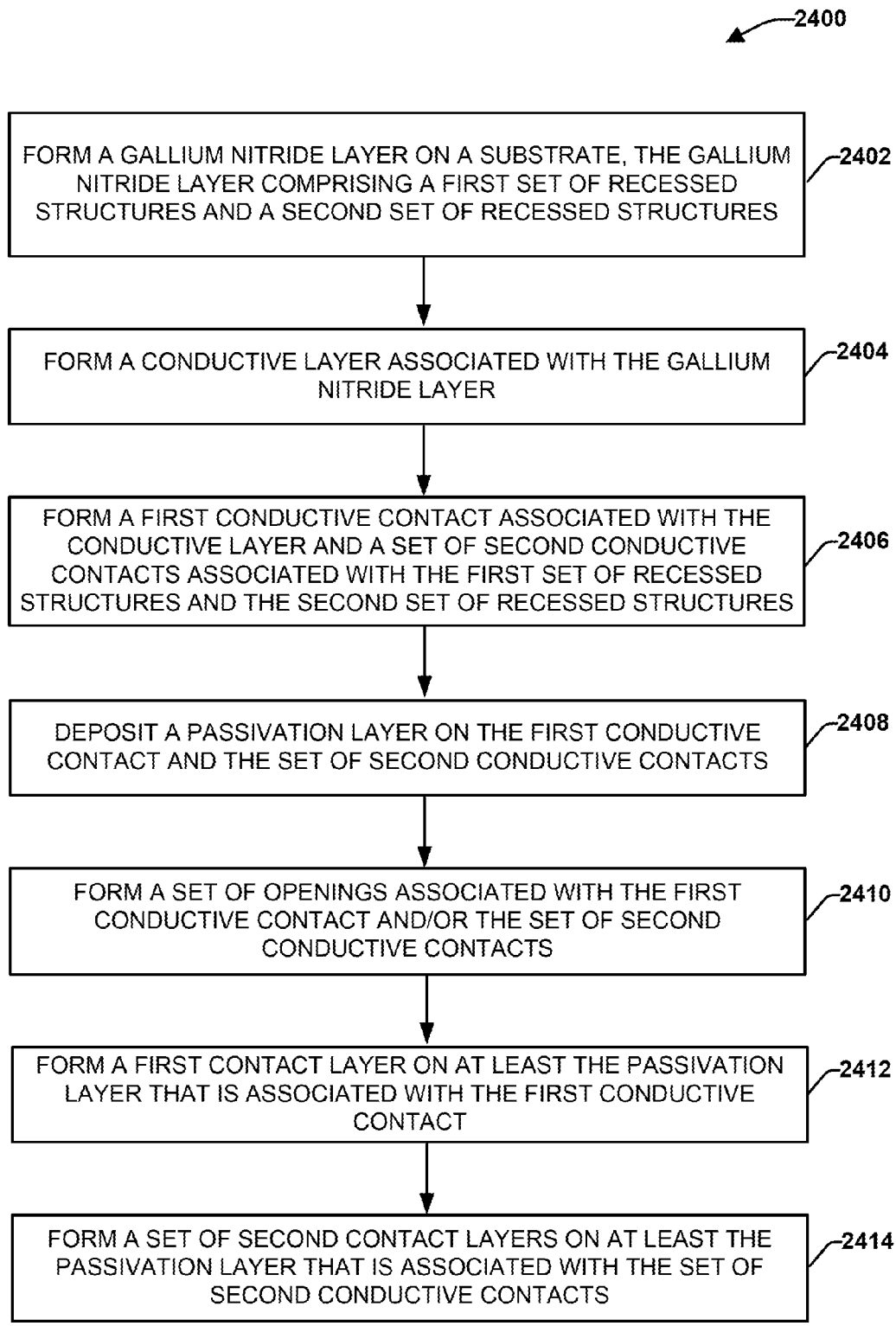
FIG. 24 presents a flow diagram of an example method for fabricating a device, in accordance with one or more embodiments described herein.

FIG. 24 illustrates a method in accordance with certain aspects of this disclosure. While, for purposes of simplicity of explanation, the method is shown and described as a series of acts, it is to be understood and appreciated that this disclosure is not limited by the order of acts, as some acts may occur in different orders and/or concurrently with other acts from that shown and described herein. For example, those skilled in the art will understand and appreciate that the method can alternatively be represented as a series of interrelated states or events, such as in a state diagram. Moreover, not all illustrated acts may be required to implement the method in accordance with certain aspects of this disclosure. Additionally, it is to be further appreciated that the method disclosed hereinafter and throughout this disclosure is capable of being stored on an article of manufacture to facilitate transporting and transferring such methods to computers.

Turning now to FIG. 24, presented is a high level flow diagram of an example method 2400 for fabricating a device (e.g., a gallium nitride FCLED, a PC-FCLED, etc.), in accordance with aspects and embodiments described herein. At 2402, a gallium nitride layer is formed on a substrate, where the gallium nitride layer comprises a first set of recessed structures and a second set of recessed structures. For example, the gallium nitride layer (e.g., gallium nitride layer 104) can be a GaN epitaxial layer that is grown on the substrate. The substrate can be, for example, a sapphire substrate. In an aspect, the gallium nitride layer can be formed via chemical vapor deposition (e.g., MOCVD, etc.). In certain implementations, the method 2400 can further include forming the first set of recessed structures and the second set of recessed structures on the gallium nitride layer based on a pattern formed by photolithography. Additionally, the method 2400 can include etching the first set of recessed structures and the second set of recessed structures via inductively coupled plasma etching.

At 2404, a conductive layer associated with the gallium nitride layer is formed. For example, the conductive layer (e.g., conductive layer 302) can be formed on the gallium nitride layer via electron beam evaporation. In one example, the conductive layer can be a conductive oxide layer (e.g., an indium tin oxide layer, etc.). In an aspect, the method 2400 can further include annealing at an atmospheric ambient pressure.

At 2406, a first conductive contact associated with the conductive layer is formed. Additionally, a set of second conductive contacts associated with the first set of recessed structures and the second set of recessed structures is formed. For example, a first conductive layer (e.g., the first conductive contact) and a second conductive layer (e.g., the set of second conductive contacts) can be formed by evaporating a set of conductive layers associated with the conductive layer (e.g., the conductive layer associated with the gallium nitride layer). The set of second conductive contacts (e.g., the second conductive layer) can be formed in each of the first set of recessed structures and the second set of recessed structures. Therefore, each of the first set of recessed structures and the second set of recessed structures can be associated with the set of second conductive contacts (e.g., the second conductive layer). Additionally, the first conductive contact (e.g., the first conductive layer) can be formed on portion(s) of the conductive layer that is not associated with the first set of recessed structures and the second set of recessed structures.

At 2408, a passivation layer is deposited on the first conductive contact and the set of second conductive contacts. Additionally, the passivation layer (e.g., passivation layer 106) can be deposited on the gallium nitride layer. For example, an oxide layer (e.g., a silicon dioxide layer), a nitride layer, a polymer layer, a polyimide layer or another type of passivation layer can be deposited on the conductive layer and/or the gallium nitride layer. In an aspect, the passivation layer can be deposited on the conductive layer and/or the gallium nitride layer via chemical vapor deposition (e.g., PECVD, etc.). In an aspect, the passivation layer can be deposited on the conductive layer and/or the gallium nitride layer via spin-coating. In yet another aspect, the passivation layer can be deposited on the conductive layer and/or the gallium nitride layer via spray-coating.

At 2410, a set of openings associated with the first conductive contact and/or the second set of conductive contacts is formed. For example, the set of openings can be formed via a wet etching technique (e.g., via buffer oxide etchant wet etching). In another example, the set of openings can be formed via a dry etching technique. In yet another example, the set of openings can be formed via a photolithography process.

At 2412, a first contact layer is formed on at least the passivation layer. The first contact layer (e.g., second conductive layer 110) is associated with the first conductive contact. For example, the first contact layer can be formed to cover at least a portion of the passivation layer and at least a portion of the first conductive contact (e.g., a set of conductive contacts associated with the first conductive contact).

At 2414, a set of second contact layers is formed on at least the passivation layer. The set of second contact layers (e.g., first conductive layers 108*a-b*) is associated with the set of second conductive contacts. For example, the first contact layer can be formed to cover at least a portion of the passivation layer and the set of second conductive contacts. In one example, the first contact layer can be formed between a contact layer and another contact layer from the set of second contact layers.

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A method, comprising:
    forming a gallium nitride layer on a substrate, the gallium nitride layer comprising a first set of recessed structures and a second set of recessed structures;
    forming a conductive layer associated with the gallium nitride layer;
    forming a first conductive contact associated with the conductive layer and a set of second conductive contacts associated with the first set of recessed structures and the second set of recessed structures;
    depositing a passivation layer on the first conductive contact and the set of second conductive contacts;
    forming a first contact layer on the passivation layer that is associated with the first conductive contact; and
    forming a set of second contact layers on the passivation layer that is associated with the second set of conductive contacts.

2. The method of claim 1, wherein the forming the gallium nitride layer comprises forming the gallium nitride layer on the substrate via chemical vapor deposition.

3. The method of claim 1, further comprising forming the first set of recessed structures and the second set of recessed structures based on a pattern formed by photolithography.

4. The method of claim 3, further comprising etching the first set of recessed structures and the second set of recessed structures via inductively coupled plasma etching.

5. The method of claim 1, wherein the forming the conductive layer comprises forming a conductive oxide layer on the gallium nitride layer.

6. The method of claim 1, wherein the forming the conductive layer comprises forming an indium tin oxide layer on the gallium nitride layer.

7. The method of claim 1, wherein the forming the conductive layer comprises forming a metal layer on the gallium nitride layer.

8. The method of claim 1, wherein the forming the conductive layer comprises annealing at an atmospheric ambient pressure.

9. The method of claim 1, wherein the forming the first conductive contact associated with the conductive layer and the set of second conductive contacts associated with the first set of recessed structures and the second set of recessed structures comprises evaporating a set of conductive layers associated with the first set of recessed structures and the second set of recessed structures.

10. The method of claim 1, wherein the depositing the passivation layer comprises depositing the passivation layer via chemical vapor deposition.

11. The method of claim 1, wherein the depositing the passivation layer comprises depositing the passivation layer via spin-coating or spray-coating.

12. The method of claim 1, wherein the depositing the passivation layer comprises depositing the passivation layer on the gallium nitride layer.

13. The method of claim 12, further comprising forming a set of openings associated with the set of second conductive contacts.

14. The method of claim 13, wherein the forming the set of openings comprises forming the set of openings via buffer oxide etchant wet etching.

15. The method of claim 13, wherein the forming the set of openings comprises forming the set of openings via dry etching or photolithography.

16. A device, comprising:
a gallium nitride layer formed on a substrate that comprises a first plurality of recesses associated with a first structure and a second plurality of recesses associated with a second structure, wherein the first plurality of recesses and the second plurality of recesses are associated with a first conductive material;
a second conductive material formed on the gallium nitride layer;
a passivation layer formed on the first conductive material, the second conductive material, and the gallium nitride layer;
a set of first conductive layers formed on the passivation layer that corresponds to the first conductive material; and
a second conductive layer formed on the passivation layer that corresponds to the second conductive material.

17. The device of claim 16, wherein the first plurality of recesses form a first contact array and a second contact array.

18. The device of claim 16, wherein the first plurality of recesses cover at least 5% of a surface area of the device.

19. The device of claim 16, wherein a surface area of a recess from the first plurality of recesses is less than or equal to 30 μm×30 μm.

20. The device of claim 16, wherein an etching depth of a recess from the first plurality of recesses and the second plurality of recesses is between a range from 0.4 nm to 2.5 μm.

21. The device of claim 16, wherein the second plurality of recesses comprise a larger surface area than the first plurality of recesses.

22. The device of claim 16, wherein the second conductive layer is implemented between a conductive layer from the set of first conductive layers and another conductive layer from the set of first conductive layers.

23. The device of claim 16, wherein the set of first conductive layers and the second conductive layer are bonded to another substrate.

24. A device, comprising:
a gallium nitride layer formed on a substrate that comprises a plurality of recessed structures associated with a set of first conductive materials;
a second conductive material formed on the gallium nitride layer;
a passivation layer formed on the first conductive material, the second conductive material, and the gallium nitride layer;
a first conductive layer formed on the passivation layer that corresponds to the set of first conductive materials; and
a second conductive layer formed on the passivation layer that corresponds to the second conductive material.

25. The device of claim 24, wherein the substrate is sapphire substrate, a silicon substrate, a silicon carbide substrate, or a gallium nitride substrate.

26. The device of claim 24, wherein the plurality of recessed structures form a contact array.

27. A method, comprising:
forming a gallium nitride layer on a substrate, the gallium nitride layer comprising a set of recessed structures;
forming a conductive contact on the gallium nitride layer and a set of conductive contacts associated with the set of recessed structures;
depositing a passivation layer on the conductive contact and the set of conductive contacts;
forming a first conductive layer on the passivation layer that is associated with the conductive contact; and
forming a set of second conductive layers on the passivation layer that is associated with the set of conductive contacts.

28. The method of claim 27, further comprising forming a set of openings associated with the set of conductive contacts.

29. The method of claim 27, further comprising forming a conductive layer associated with the gallium nitride layer.

* * * * *